(12) United States Patent
Sasaki

(10) Patent No.: US 10,910,599 B2
(45) Date of Patent: Feb. 2, 2021

(54) LUMINESCENT PANEL, LUMINESCENT DEVICE, AND ELECTRONIC APPARATUS

(71) Applicant: JOLED INC., Tokyo (JP)

(72) Inventor: Atsushi Sasaki, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/734,787

(22) Filed: Jan. 6, 2020

(65) Prior Publication Data

US 2020/0227665 A1   Jul. 16, 2020

(30) Foreign Application Priority Data

Jan. 11, 2019   (JP) ................................. 2019-003385

(51) Int. Cl.
*H01L 51/52*   (2006.01)
*H01L 51/50*   (2006.01)
*H01L 51/00*   (2006.01)

(52) U.S. Cl.
CPC ...... *H01L 51/5256* (2013.01); *H01L 51/0094* (2013.01); *H01L 51/5012* (2013.01); *H01L 51/5243* (2013.01); *H01L 51/5253* (2013.01); *H01L 51/5259* (2013.01); *H01L 2251/5346* (2013.01)

(58) Field of Classification Search
CPC ............. H01L 51/5012; H01L 51/5259; H01L 51/524–5243; H01L 51/5253–5256; H01L 51/0097; H01L 2251/5338
See application file for complete search history.

(56) References Cited

U.S. PATENT DOCUMENTS

| 6,268,695 | B1 * | 7/2001 | Affinito | H01M 2/08 313/504 |
|---|---|---|---|---|
| 2002/0140347 | A1 | 10/2002 | Weaver | |
| 2003/0034497 | A1 * | 2/2003 | Yamazaki | H01L 27/326 257/86 |
| 2003/0189403 | A1 * | 10/2003 | Yamada | C23C 16/403 313/511 |
| 2004/0041147 | A1 * | 3/2004 | Park | H01L 51/5256 257/40 |

(Continued)

FOREIGN PATENT DOCUMENTS

| CN | 107482127 | 12/2017 |
|---|---|---|
| JP | 2011-138776 | 7/2011 |

(Continued)

*Primary Examiner* — Errol V Fernandes
*Assistant Examiner* — Jeremy J Joy
(74) *Attorney, Agent, or Firm* — Greenblum & Bernstein, P.L.C.

(57) ABSTRACT

A luminescent panel includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films each provided with a plurality of fracture control parts. The fracture control parts each include an inorganic material having relatively lower mechanical strength than parts of the one or plurality of inorganic sealing films other than the fracture control parts.

12 Claims, 14 Drawing Sheets

(56) References Cited

U.S. PATENT DOCUMENTS

| | | | | |
|---|---|---|---|---|
| 2010/0089636 | A1* | 4/2010 | Ramadas | B82Y 15/00 |
| | | | | 174/521 |
| 2011/0198620 | A1* | 8/2011 | Han | H05B 33/04 |
| | | | | 257/88 |
| 2011/0287233 | A1* | 11/2011 | Ma | B32B 27/38 |
| | | | | 428/195.1 |
| 2012/0256202 | A1* | 10/2012 | Lee | H01L 23/31 |
| | | | | 257/88 |
| 2014/0152174 | A1* | 6/2014 | Wang | H01L 51/5253 |
| | | | | 313/511 |
| 2014/0214504 | A1* | 7/2014 | Young | G06Q 50/01 |
| | | | | 705/14.5 |
| 2016/0079329 | A1* | 3/2016 | Lee | H01L 27/3244 |
| | | | | 257/40 |
| 2016/0141551 | A1* | 5/2016 | Seo | H01L 51/5253 |
| | | | | 257/40 |
| 2016/0226021 | A1* | 8/2016 | Lee | H01L 51/5237 |
| 2016/0254489 | A1 | 9/2016 | Sun et al. | |
| 2017/0117504 | A1* | 4/2017 | Kim | H01L 27/3244 |
| 2017/0194365 | A1* | 7/2017 | Cai | H01L 27/1218 |
| 2017/0244066 | A1* | 8/2017 | Kamiya | H01L 51/56 |
| 2017/0279073 | A1* | 9/2017 | Nagata | H01L 51/5246 |
| 2017/0338442 | A1* | 11/2017 | Ishida | H01L 51/5256 |
| 2018/0026229 | A1* | 1/2018 | Kokame | H01L 51/5253 |
| | | | | 257/88 |
| 2018/0040849 | A1* | 2/2018 | Ishida | H01L 51/56 |
| 2018/0212186 | A1* | 7/2018 | Jin | H01L 51/5253 |
| 2019/0036076 | A1 | 1/2019 | Tang | |
| 2019/0058162 | A1* | 2/2019 | Hong | H01L 51/5256 |
| 2020/0106051 | A1* | 4/2020 | Kamiya | H01L 51/5275 |

FOREIGN PATENT DOCUMENTS

| | | |
|---|---|---|
| JP | 2018-014284 | 1/2018 |
| WO | 2016/132721 | 8/2016 |

* cited by examiner

LUMINESCENT PANEL, LUMINESCENT DEVICE, AND ELECTRONIC APPARATUS

CROSS REFERENCE TO RELATED APPLICATIONS

This application claims the benefit of Japanese Priority Patent Application No. 2019-003385 filed on Jan. 11, 2019, the entire contents of which are incorporated herein by reference.

BACKGROUND

The disclosure relates to a luminescent panel, a luminescent device, and an electronic apparatus.

Various kinds of luminescent panels including organic electroluminescent elements have been proposed. Such a luminescent panel using organic electroluminescent elements is disclosed in International Publication No. WO 2016/132721, for example.

SUMMARY

Improvements in resistance to environment have been demanded for luminescent panels.

It is desirable to provide a luminescent panel, a luminescent device, and an electronic apparatus with improved resistance to environment.

A luminescent panel according to a first aspect of the disclosure includes, an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films each provided with a plurality of fracture control parts. The fracture control parts each includes an inorganic material having relatively lower mechanical strength than parts of the one or plurality of inorganic sealing films other than the fracture control parts.

A luminescent panel according to a second aspect of the disclosure includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films each provided with a plurality of compression stress parts. The compression stress parts have relatively higher compression stress than parts of the one or plurality of inorganic sealing films other than the compression stress parts.

A luminescent panel according to a third aspect of the disclosure includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films and one or a plurality of resin layers. The resin layers are each provided in corresponding one of the one or plurality of inorganic sealing films to selectively apply compression stress to predetermined parts of the corresponding one of the one or plurality of inorganic sealing films.

A luminescent device according to a fourth aspect of the disclosure includes a luminescent panel and a drive part that drives the luminescent panel. The luminescent panel includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films each provided with a plurality of fracture control parts. The fracture control parts each includes an inorganic material having relatively lower mechanical strength than parts of the one or plurality of inorganic sealing films other than the fracture control parts.

A luminescent device according to a fifth aspect of the disclosure includes a luminescent panel and a drive part that drives the luminescent panel. The luminescent panel includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films each provided with a plurality of compression stress parts. The compression stress parts each have higher compression stress than parts of the one or plurality of inorganic sealing films other than the compression stress parts.

A luminescent device according to a sixth aspect of the disclosure includes a luminescent device including a luminescent panel and a drive part that drives the luminescent pane. The luminescent panel includes an upper sealing layer, a lower sealing layer, and an organic electroluminescent layer. The upper sealing layer is provided between the upper sealing layer and the lower sealing layer and includes one or a plurality of organic electroluminescent elements. At least one of the upper sealing layer or the lower sealing layer includes one or a plurality of inorganic sealing films and one or a plurality of resin layers. The one or plurality of resin layers is each provided in corresponding one of the one or plurality of inorganic sealing films to selectively apply compression stress to predetermined parts of the corresponding one of the one or plurality of inorganic sealing films.

An electronic apparatus according to a seventh aspect of the disclosure includes a luminescent device including a luminescent panel and a drive part that drives the luminescent panel. The luminescent panel includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films each provided with a plurality of fracture control parts. The fracture control parts each includes an inorganic material having relatively lower mechanical strength than parts of the one or plurality of inorganic sealing films other than the fracture control parts.

An electronic apparatus according to an eighth aspect of the disclosure includes a luminescent device including a luminescent panel and a drive part that drives the luminescent panel. The luminescent panel includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films each provided with a plurality of compression stress parts. The compression stress parts each have relatively higher compression stress than parts of the one or plurality of inorganic sealing films other than the compression stress parts.

An electronic apparatus according to a ninth aspect of the disclosure includes a luminescent device including a luminescent panel and a drive part that drives the luminescent panel. The luminescent panel includes an upper sealing layer, a lower sealing layer, and an organic electroluminescent layer. The organic electroluminescent layer is provided between the upper sealing layer and the lower sealing layer and includes one or a plurality of organic electroluminescent elements. At least one of the upper sealing layer or the lower sealing layer includes one or a plurality of inorganic sealing films and one or a plurality of resin layers. The one or plurality of resin layers is each provided in corresponding one of the one or plurality of inorganic sealing films to selectively apply compression stress to predetermined parts of the corresponding one of the one or plurality of inorganic sealing films.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
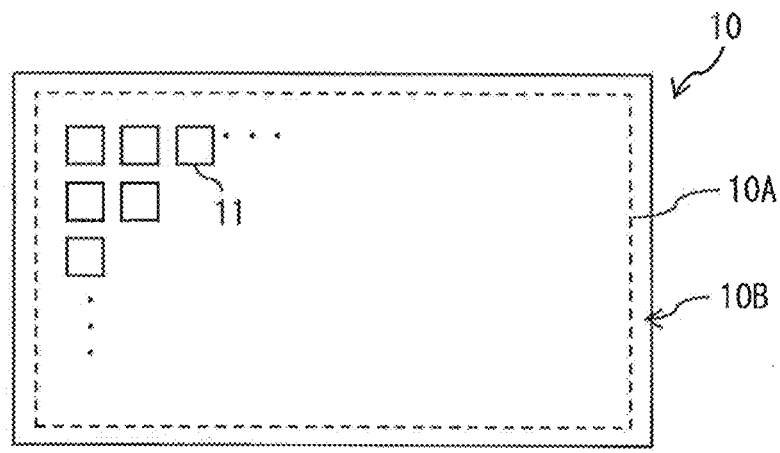
FIG. 1 is a plan view of an example configuration of a luminescent panel according to one example embodiment of the disclosure.

In the following, some example embodiments, modification examples, and application examples of the technology are described in detail, in the following order, with reference to the accompanying drawings. Note that the following description is directed to illustrative examples of the technology and not to be construed as limiting to the technology.

Factors including, without limitation, numerical values, shapes, materials, components, positions of the components, and how the components are coupled to each other are illustrative only and not to be construed as limiting to the technology. Further, elements in the following example embodiments, the modification examples, and the application examples which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. First Embodiment (Luminescent Panel)
2. Modification Examples to First Embodiment (Luminescent Panel)
3. Second Embodiment (Luminescent Device)
4. Application Examples (Electronic Apparatus, Lighting Apparatus)

1. First Embodiment

[Configuration]

FIG. 1 illustrates an example planar configuration of a luminescent panel 10 according to a first embodiment of the disclosure. The luminescent panel 10 may be a flexible panel. The luminescent panel 10 may be assembled in a luminescent device 1, an electronic apparatus 2, and an illumination part 410, described later, for example. The luminescent device 1, the electronic apparatus 2, and the illumination part 410 may be hereinafter collectively referred to as "products". The luminescent panel 10 may be assembled in such products as described above in such a manner that the luminescent panel 10 is able to be bent or curved by a user in only a certain direction or a bending direction. The luminescent panel 10 may otherwise be assembled in such products as described above after being bent or curved in the bending direction. In a case where the luminescent panel 10 has a rectangular shape, the bending direction may correspond to a longitudinal direction of the luminescent panel 10. The bending direction may otherwise correspond to a lateral direction of the luminescent panel 10. The luminescent panel 10 will now be described herein on the supposition that the bending direction corresponds to the longitudinal direction of the luminescent panel 10.

As a controller 20 and a driver 30 described later drive pixels 11 in an active matrix manner, for example, the luminescent panel 10 may display an image based on image signals and synchronization signals received from an external device. The luminescent panel 10 may include a plurality of scanning lines WSL extending along a row axis, a plurality of signal lines DTL extending along a column axis, a plurality of power lines DSL extending along the row axis, and the plurality of pixels 11 disposed in a matrix. The plurality of pixels 11 may be provided in a luminescent region 10A of the luminescent panel 10. In the luminescent panel 10, a non-luminescent region 10B may be provided around the luminescent region 10A. The non-luminescent region 10B may correspond to a frame region of the luminescent panel 10. The frame region may have a rectangular annular shape surrounding the luminescent region 10A.

The scanning lines WSL may be used to select the pixels 11. The scanning lines WSL may supply, to the pixels 11, selection pulses that select the pixels 11 per a predetermined unit. The predetermined unit may be a pixel row, for example. The signal lines DTL may be used to supply, to the pixels 11, a signal voltage corresponding to an image signal. That is, the signal lines DTL may supply, to the pixels 11, data pulses at the signal voltage. The power lines DSL may supply electric power to the pixels 11.

The plurality of pixels 11 may include, for example, pixels that emit red light, pixels that emit green light, and pixels that emit blue light. The plurality of pixels 11 may further include pixels that emit other colors, such as white and yellow.

Figure 2:
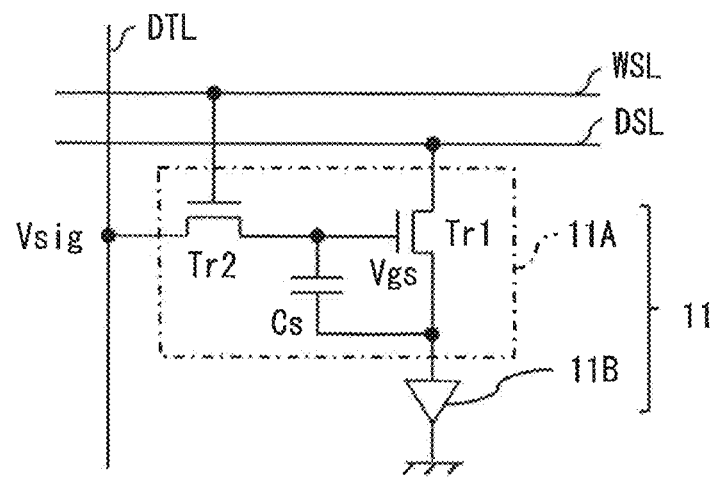
FIG. 2 is a diagram illustrating an example circuit configuration of a pixel illustrated in FIG. 1.

FIG. 2 illustrates an example circuit configuration of each of the pixels 11. The pixel 11 may include a pixel circuit 11A and an organic electroluminescent (EL) element 11B.

The pixel circuit 11A may control light emission and light extinction of the organic EL element 11B. The pixel circuit 11A may hold a voltage written into the pixel 11 through writing and scanning. The pixel circuit 11A may include a driving transistor Tr1, a switching transistor Tr2, and a storage capacitor Cs, for example.

The switching transistor Tr2 may control an application of a signal voltage Vsig to a gate of the driving transistor Tr1. In a specific but non-limiting example, the switching transistor Tr2 may sample a voltage from each of the signal lines DTL. The switching transistor Tr2 may then write the voltage obtained through the sampling to the gate of the driving transistor Tr1. The driving transistor Tr1 may be serially coupled to the organic EL element 11B. The driving transistor Tr1 may drive the organic EL element 11B. The driving transistor Tr1 may control a current flowing into the organic EL element 11B in accordance with the magnitude of the voltage sampled by the switching transistor Tr2. The storage capacitor Cs may hold a predetermined voltage between the gate and a source of the driving transistor Tr1. The storage capacitor Cs may hold a voltage Vgs between the gate and the source of the driving transistor Tr1 during a predetermined period of time. The pixel circuit 11A may have a circuit configuration including such a two-transistor-and-one capacitor (2Tr1C) circuit described above and additional various capacitors and transistors. The pixel circuit 11A may otherwise differ in circuit configuration from such a 2Tr1C circuit described above.

A gate of the switching transistor Tr2 may be coupled to each of the scanning lines WSL. One of a source or a drain of the switching transistor Tr2 may be coupled to each of the signal lines DTL. The other out of the source and the drain of the switching transistor Tr2, whichever is not coupled to each of the signal lines DTL, may be coupled to the gate of the driving transistor Tr1. One of the source and a drain of the driving transistor Tr1 may be coupled to each of the power lines DSL. The other out of the source and the drain of the driving transistor Tr1, whichever is not coupled to each of the power lines DSL, may be coupled to an anode of the organic EL element 11B. One end of the storage capacitor Cs may be coupled to the gate of the driving transistor Tr1. Another end of the storage capacitor Cs may be coupled to a terminal of either of the source and the drain of the driving transistor Tr1, whichever lies adjacent to the organic EL element 11B.

Figure 3:
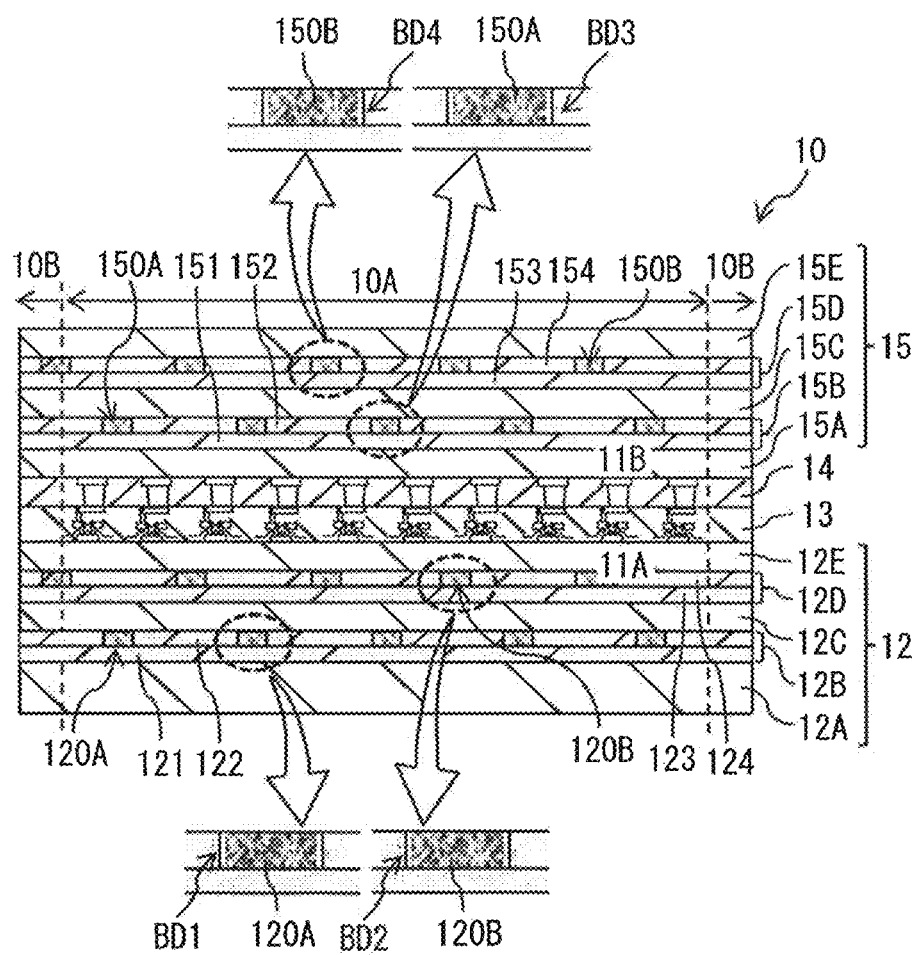
FIG. 3 is a cross-sectional view of an example configuration of the luminescent panel illustrated in FIG. 1.

FIG. 3 illustrates an example cross-sectional configuration of the luminescent panel 10. The luminescent panel 10 may include an EL layer 14 and a thin-film transistor (TFT) layer 13. The EL layer 14 may include the plurality of organic EL elements 11B. In one embodiment, the EL layer 14 corresponds to a specific but non-limiting example of an "organic electroluminescent layer". The TFT layer 13 may include the plurality of pixel circuits 11A. The plurality of pixel circuits 11A may be allocated one by one to the respective organic EL elements 11B. The luminescent panel 10 may further include a lower sealing layer 12 and an upper sealing layer 15. The lower sealing layer 12 and the upper sealing layer 15 may hold the EL layer 14 and the TFT layer 13 therebetween.

The lower sealing layer 12 may prevent moisture, for example, from entering the EL layer 14 to improve resistance to environment of the luminescent panel 10. The lower sealing layer 12 may be a laminate of an inorganic sealing film 12B, a resin layer 12C, an inorganic sealing film 12D, and a resin layer 12E stacked in order on the substrate 12A, for example.

The substrate 12A may be a flexible substrate that supports the TFT layer 13 and the EL layer 14. The substrate 12A may include a resin material. The substrate 12A may include polyimide resin, acrylic resin, styrene resin, polycarbonate resin, epoxy resin, polyethylene, polyester, or silicone resin, for example. The resin layer 12C may be a layer provided between the inorganic sealing film 12B and the inorganic sealing film 12D. The resin layer 12C may include a resin material. The resin layer 12C may include polyimide resin, acrylic resin, styrene resin, polycarbonate resin, epoxy resin, polyethylene, polyester, or silicone resin, for example. The resin layer 12E may serve as a base layer on which the TFT layer 13 is formed. The resin layer 12E may include a resin material. The resin layer 12E may include polyimide resin, acrylic resin, styrene resin, polycarbonate resin, epoxy resin, polyethylene, polyester, or silicone resin, for example. The substrate 12A, the resin layer 12C, and the resin layer 12E may include a resin material containing a desiccant including a metal organic compound or an inorganic compound, for example.

The inorganic sealing film 12B may be provided closer to the substrate 12A than the inorganic sealing film 12D is. The inorganic sealing film 12B may prevent moisture, for example, from entering the EL layer 14. The inorganic sealing film 12B may include an alumina layer 121 and a silicon nitride (SiN) layer 122. The inorganic sealing film 12B may be a composite layer including the alumina layer 121 and the SiN layer 122 laminated in order from the substrate 12A, for example. The inorganic sealing film 12D may be provided closer to the EL layer 14 than the inorganic sealing film 12B is. The inorganic sealing film 12D may prevent moisture, for example, from entering the EL layer 14. The inorganic sealing film 12D may include an alumina layer 123 and an SiN layer 124. The inorganic sealing film 12D may be a composite layer including the alumina layer 123 and the SiN layer 124 laminated in order from the substrate 12A, for example.

The SiN layer 122 may include a plurality of fracture control parts 120A on both the luminescent region 10A and the non-luminescent region 10B. The fracture control parts 120A may each extend from an upper surface of the inorganic sealing film 12B in a depth that does not reach a lower surface of the inorganic sealing film 12B. The alumina layer 121 may therefore extend over the whole surface of the luminescent panel 10. The SiN layer 124 may include a plurality of fracture control parts 120B on both the luminescent region 10A and the non-luminescent region 10B. The fracture control parts 120B may each extend from an upper surface of the inorganic sealing film 12D to a depth that does not reach a lower surface of the inorganic sealing film 12D. The alumina layer 123 may therefore extend over the whole surface of the luminescent panel 10.

In this embodiment, the luminescent panel 10 may have a rectangular shape as illustrated in FIG. 1, and the luminescent panel 10 may be bent in the longitudinal direction of the luminescent panel 10. The fracture control parts 120A and 120B of this embodiment may extend in a direction intersecting (e.g., orthogonal to) the longitudinal direction of the luminescent panel 10. The fracture control parts 120A and 120B may include an inorganic material having relatively lower mechanical strength, compared with other parts.

In an example in which the SiN layer 122 includes silicon nitride (SiNx), the fracture control parts 120A may include silicon oxynitride (SiOxNy) or silicon oxide (SiOx). In the SiN layer 122 of this example, the fracture control parts 120A may include silicon oxynitride (SiOxNy) or silicon oxide (SiOx), and other parts may include silicon nitride (SiNx). Such an SiN layer 122 may be formed by oxidizing some portions of a silicon nitride (SiNx) film into silicon oxynitride (SiOxNy) portions or silicon oxide (SiOx) portions, for example. In an example in which the SiN layer 124 includes silicon nitride (SiNx), the fracture control parts 120B may include silicon oxynitride (SiOxNy) or silicon oxide (SiOx). In the SiN layer 124 of this example, the fracture control parts 120B may include silicon oxynitride (SiOxNy) or silicon oxide (SiOx), and other parts may include silicon nitride (SiNx). Such an SiN layer 124 may be formed by oxidizing some portions of a silicon nitride (SiNx) film into silicon oxynitride (SiOxNy) portions or silicon oxide (SiOx) portions, for example.

Figure 4:
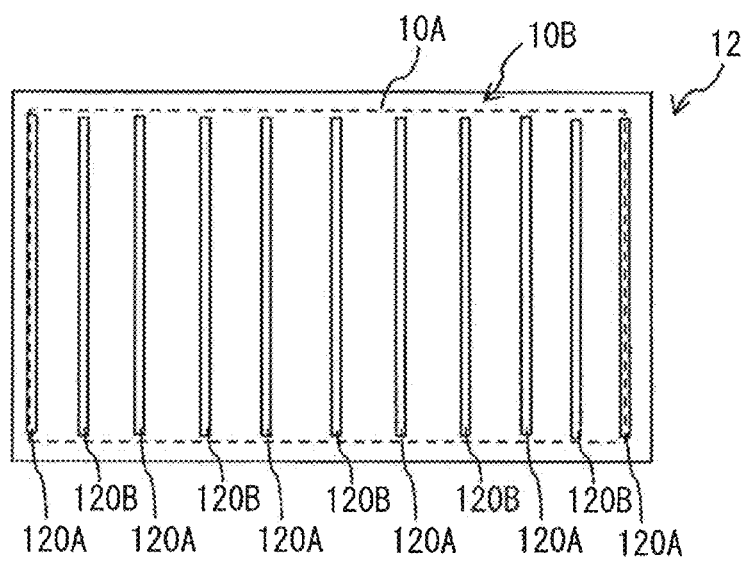
FIG. 4 is a plan view of an example configuration of a lower sealing layer illustrated in FIG. 3.
Figure 5:
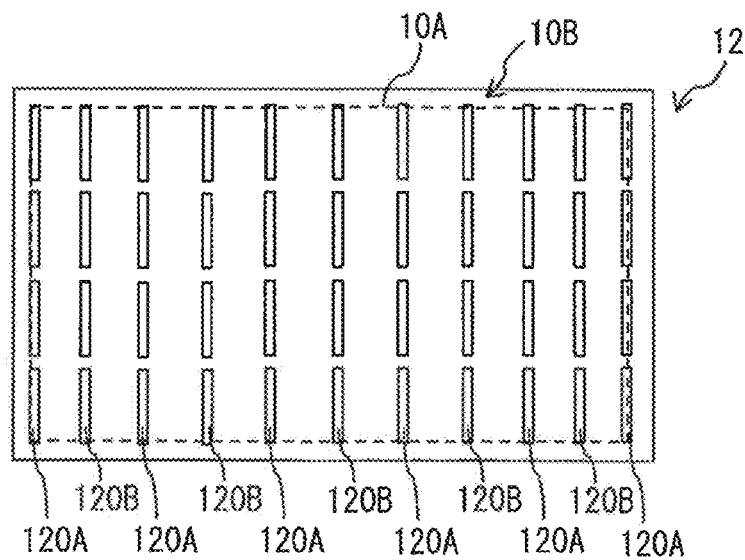
FIG. 5 is a plan view of an example configuration of the lower sealing layer illustrated in FIG. 3.

FIGS. 4 and 5 illustrate example planar configurations of the lower sealing layer 12. The plurality of fracture control parts 120A and the plurality of fracture control parts 120B may be provided at respective positions not opposed to each other in a layered direction. In one example embodiment, the plurality of fracture control parts 120A and the plurality of fracture control parts 120B may be disposed away from each other as far as possible, when viewed in a normal direction of the lower sealing layer 12, for example. The plurality of fracture control parts 120A and the plurality of fracture control parts 120B may be disposed at equal intervals, when viewed in the normal direction of the lower sealing layer 12, for example. In a specific but non-limiting example, a direction in which the plurality of fracture control parts 120A and the plurality of fracture control parts 120B are opposed to each other may be parallel to the bending direction, for example. In a case where the substrate 12A, the resin layer 12C, and the resin layer 12E include a resin material containing a desiccant as described above, the plurality of fracture control parts 120A and the plurality of fracture control parts 120B may be disposed away from each other at an interval of approximately 1 mm, when viewed in the normal direction of the lower sealing layer 12, for example.

Alumina is higher in barrier properties (transmission prevention properties) against moisture, for example, compared with silicon oxynitride (SiOxNy) and silicon oxide (SiOx). Even in a case where the fracture control parts 120A and 120B are provided in the respective SiN layers 122 and 124, the alumina layers 121 and 123 may accordingly keep the barrier properties (transmission prevention properties) against moisture, for example. Even in a case where a fracture is caused in any of the fracture control parts 120A and 120B in the respective inorganic sealing films 12B and 12D by bending or curving the luminescent panel 10, a route of moisture, for example, from the substrate 12A to the EL layer 14 may be longer by a distance between each of the fracture control parts 120A and adjacent one of the fracture control parts 120B, when viewed in the normal direction of the lower sealing layer 12, compared with a case where the fracture control parts 120A and 120B are provided at respective positions opposed to each other in the layered direction.

It is therefore possible to improve the resistance to environment of luminescent panel 10.

At each boundary BD1 between a region in which the fracture control part 120A is provided and a region in which the fracture control part 120A is not provided, a composition may be steeply or gradually changed. The boundary at which a composition is gradually changed may be formed by selectively oxidizing the SiN layer 122 through plasma oxidation, for example, so that the composition moderately changes at the boundary. Forming the fracture control parts 120A through plasma oxidation, as described above, may generate substantially no unevenness on a surface of the SiN layer 122. The provision of the fracture control parts 120A thus causes no negative effects on the TFT layer 13 and the EL layer 14.

At each boundary BD2 between a region in which the fracture control part 120B is provided and a region in which the fracture control parts 120B is not provided, a composition may be steeply or gradually changed. The boundary at which a composition is gradually changed may be formed by selectively oxidizing the SiN layer 124 through plasma oxidation, for example, so that the composition moderately changes at the boundary. Forming the fracture control parts 120B through plasma oxidation, as described above, may generate substantially no unevenness on a surface of the SiN layer 124. The provision of the fracture control parts 120B may thus cause no negative effects on the TFT layer 13 and the EL layer 14.

In a case where the luminescent panel 10 has a rectangular shape, as illustrated in FIG. 1, and where the bending direction of the luminescent panel 10 corresponds to the lateral direction of the luminescent panel 10, the fracture control parts 120A and 120B may extend in a direction intersecting (e.g., orthogonal to) the lateral direction of the luminescent panel 10. The fracture control parts 120A may be formed in stripes as illustrated in FIGS. 4 and 5. Alternatively, the fracture control parts 120A may be formed in dots or shapes combined with stripes and dots. In a case where the fracture control parts 120A are formed in dots, an arrangement direction of the plurality of fracture control parts 120A may be parallel to the bending direction of the luminescent panel 10. The fracture control parts 120B may be formed in stripes as illustrated in FIGS. 4 and 5. Alternatively, the fracture control parts 120B may be formed in dots or shapes combined with stripes and dots. In a case where the fracture control parts 120B are formed in dots, an arrangement direction of the plurality of fracture control parts 120B may be parallel to the bending direction of the luminescent panel 10.

The upper sealing layer 15 may prevent moisture, for example, from entering the EL layer 14 to improve the resistance to environment of the luminescent panel 10. The upper sealing layer 15 may be a laminate of a resin layer 15A, an inorganic sealing film 15B, a resin layer 15C, an inorganic sealing film 15D, and a resin layer 15E stacked in order on the EL layer 14, for example.

The resin layer 15A may serve as a planarizing film that uniforms an uneven surface formed by the TFT layer 13 and the EL layer 14. The resin layer 15A may include a resin material having light transmitting properties. The resin layer 15A may include polyimide resin, acrylic resin, styrene resin, polycarbonate resin, epoxy resin, polyethylene, polyester, or silicone resin, for example. The resin layer 15C may be a layer provided between the inorganic sealing film 15B and the inorganic sealing film 15D. The resin layer 15C may include a resin material having light transmitting properties. The resin layer 15C may include polyimide resin, acrylic resin, styrene resin, polycarbonate resin, epoxy resin, polyethylene, polyester, or silicone resin, for example. The resin layer 15E may be a top layer serving as a luminescent face of the luminescent panel 10. The resin layer 15E may include a resin material having light transmitting properties. The resin layer 15E may include polyimide resin, acrylic resin, styrene resin, polycarbonate resin, epoxy resin, polyethylene, polyester, or silicone resin, for example. The resin layer 15A, the resin layer 15C, and the resin layer 15E may include a resin material containing a desiccant including a metal organic compound or an inorganic compound, for example.

The inorganic sealing film 15B may be provided closer to the EL layer 14 than the inorganic sealing film 15D is. The inorganic sealing film 15B may prevent moisture, for example, from entering the EL layer 14. The inorganic sealing film 15B may be a composite layer including an alumina layer 151 and an SiN layer 152 laminated in order from the substrate 12A, for example. The inorganic sealing film 15D may be provided closer to a top surface of the luminescent panel 10 than the inorganic sealing film 15B is. The inorganic sealing film 15D may prevent moisture, for example, from entering the EL layer 14. The inorganic sealing film 15D may be a composite layer including an alumina layer 153 and an SiN layer 154 laminated in order from the substrate 12A, for example.

The SiN layer 152 may include a plurality of fracture control parts 150A on both the luminescent region 10A and the non-luminescent region 10B. The fracture control parts 150A may each extend from an upper surface of the inorganic sealing film 15B to a depth that does not reach a lower surface of the inorganic sealing film 15B. The alumina layer 151 may therefore extend over the whole surface of the luminescent panel 10. The SiN layer 154 may include a plurality of fracture control parts 150B on both the luminescent region 10A and the non-luminescent region 10B. The fracture control parts 150B may each extend from an upper surface of the inorganic sealing film 15D to a depth that does not reach a lower surface of the inorganic sealing film 15D. The alumina layer 153 may therefore cover over the whole surface of the luminescent panel 10.

In this embodiment, the luminescent panel 10 may have a rectangular shape as illustrated in FIG. 1, and the luminescent panel 10 may be bent in the longitudinal direction of the luminescent panel 10. The fracture control parts 150A and 150B of this embodiment may extend in a direction intersecting (e.g., orthogonal to) the longitudinal direction of the luminescent panel 10. The fracture control parts 150A and 150B may include an inorganic material having relatively lower mechanical strength, compared with other parts.

In an example in which the SiN layer 152 includes silicon nitride (SiNx), the fracture control parts 150A may include silicon oxynitride (SiOxNy) or silicon oxide (SiOx). In the SiN layer 152 of this example, the fracture control parts 150A may include silicon oxynitride (SiOxNy) or silicon oxide (SiOx), and other parts may include silicon nitride (SiNx). Such an SiN layer 152 may be formed by oxidizing some portions of a silicon nitride (SiNx) film into silicon oxynitride (SiOxNy) portions or silicon oxide (SiOx) portions, for example. In an example in which the SiN layer 154 includes silicon nitride (SiNx), the fracture control parts 150B may include silicon oxynitride (SiOxNy) or silicon oxide (SiOx). In the SiN layer 154 of this example, the fracture control parts 150B may include silicon oxynitride (SiOxNy) or silicon oxide (SiOx), and other parts may include silicon nitride (SiNx). Such an SiN layer 154 may may be formed by oxidizing some portions of a silicon nitride (SiNx) film into silicon oxynitride (SiOxNy) portions or silicon oxide (SiOx) portions, for example.

Figure 6:
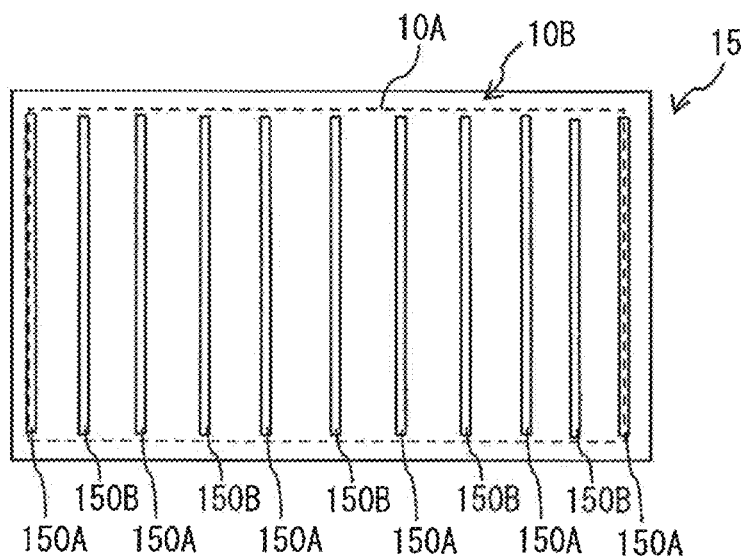
FIG. 6 is a plan view of an example configuration of an upper sealing layer illustrated in FIG. 3 according to a modification example.
Figure 7:
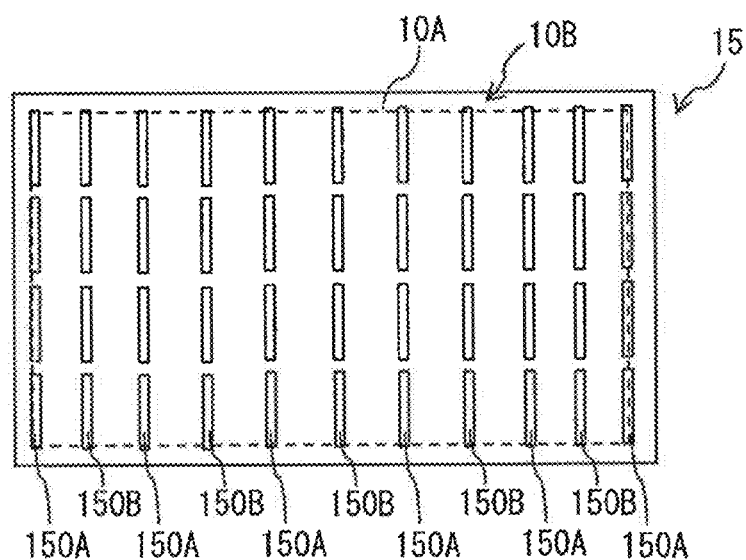
FIG. 7 is a plan view of an example configuration of the upper sealing layer illustrated in FIG. 3 according to a modification example.

FIGS. 6 and 7 illustrate example planar configurations of the upper sealing layer 15. The plurality of fracture control parts 150A and the plurality of fracture control parts 150B may be provided at respective positions not opposed to each other in the layered direction. In one example embodiment, the plurality of fracture control parts 150A and the plurality of fracture control parts 150B may be disposed away from each other as far as possible, when viewed in the normal direction of the upper sealing layer 15, for example. The plurality of fracture control parts 150A and the plurality of fracture control parts 150B may be disposed at equal intervals, when viewed in the normal direction of the upper sealing layer 15, for example. In a specific but non-limiting example, a direction in which the plurality of fracture control parts 150A and the plurality of fracture control parts 150B are opposed to each other may be parallel to the bending direction, for example. In a case where the resin layer 15A, the resin layer 15C, and the resin layer 15E include a resin material containing a desiccant, as described above, the plurality of fracture control parts 150A and the plurality of fracture control parts 150B may be disposed away from each other at an interval of approximately 1 mm, when viewed in the normal direction of the upper sealing layer 15, for example.

Alumina is higher in barrier properties (transmission prevention properties) against moisture, for example, compared with silicon oxynitride (SiOxNy) and silicon oxide (SiOx). Even in a case where the fracture control parts 150A and 150B are provided in the respective SiN layers 152 and 154, the alumina layers 151 and 153 may accordingly keep the barrier properties (transmission prevention properties) against moisture, for example. Even in a case where a fracture is caused in any of the fracture control parts 150A and 150B in the respective inorganic sealing films 15B and 15D by bending or curving the luminescent panel 10, a route of moisture, for example, from the resin layer 15E to the EL layer 14 may be longer by a distance between each of the fracture control parts 150A and adjacent one of the fracture control parts 150B, when viewed in the normal direction of the upper sealing layer 15, compared with a case where the fracture control parts 150A and 150B are provided at respective positions opposed to each other in the layered direction. It is therefore possible to improve the resistance to environment of luminescent panel 10.

At each boundary BD3 between a region in which the fracture control part 150A is provided and a regions in which the fracture control part 150A is not provided with the fracture control parts 150A, a composition may be steeply or gradually changed. At each boundary BD4 between a region in which the fracture control part 150B is provided and a region in which the fracture control part 150B is not provided, a composition may be steeply or gradually changed.

In a case where the luminescent panel 10 has a rectangular shape, as illustrated in FIG. 1, and where the bending direction of the luminescent panel 10 corresponds to the lateral direction of the luminescent panel 10, the fracture control parts 150A and 150B may extend in a direction intersecting (e.g., orthogonal to) the lateral direction of the luminescent panel 10. The fracture control parts 150A may be formed in stripes as illustrated in FIGS. 6 and 7. Alternatively, the fracture control parts 120A may be formed in dots or shapes combined with stripes and dots. In a case where the fracture control parts 150A are formed in dots, an arrangement direction of the plurality of fracture control parts 150A may be parallel to the bending direction of the luminescent panel 10. The fracture control parts 150B may be formed in stripes as illustrated in FIGS. 6 and 7. Alternatively, the fracture control parts 150B may be formed in dots or shapes combined with stripes and dots. In a case where the fracture control parts 150B are formed in dots, an arrangement direction of the plurality of fracture control parts 150B may be parallel to the bending direction of the luminescent panel 10.

[Manufacturing Method]

Next, a manufacturing method for the fracture control parts 120A will now be described herein. FIGS. 8A to 8E illustrate an example process for manufacturing the inorganic sealing film 12B included in the lower sealing layer 12 of the luminescent panel 10 according to the example embodiment.

Figure 8A:
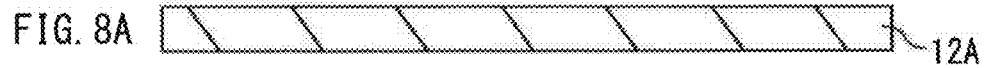
FIG. 8A illustrates an example process for manufacturing an inorganic sealing layer included in the lower sealing layer illustrated in FIG. 3.
Figure 8B:
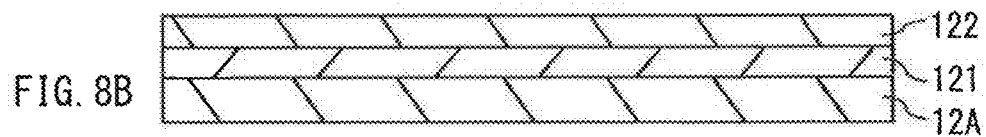
FIG. 8B illustrates an example process for manufacturing an inorganic sealing layer included in the lower sealing layer illustrated in FIG. 3.
Figure 8C:
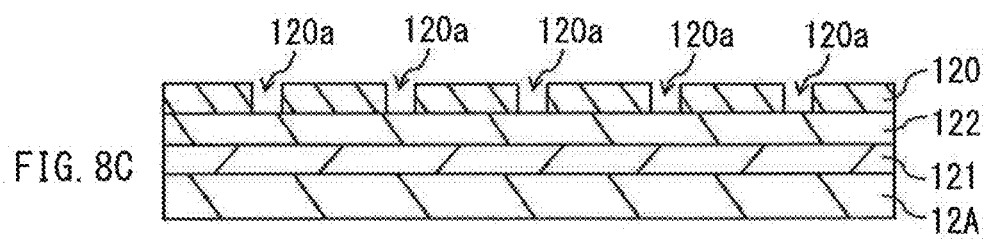
FIG. 8C illustrates an example process for manufacturing an inorganic sealing layer included in the lower sealing layer illustrated in FIG. 3.
Figure 8D:
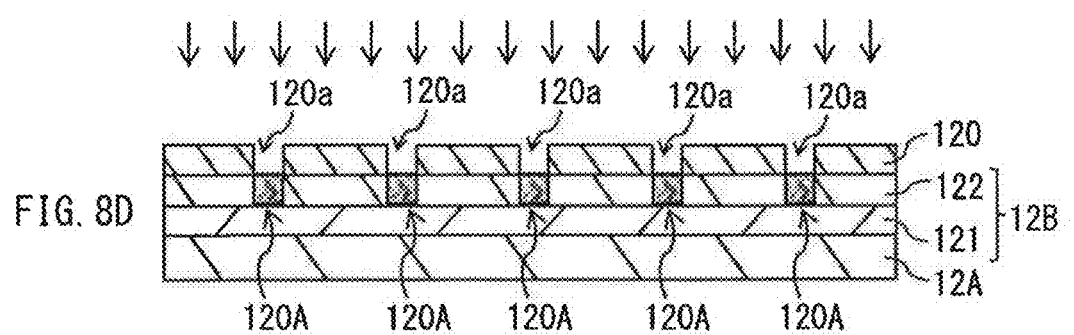
FIG. 8D illustrates an example process for manufacturing an inorganic sealing layer included in the lower sealing layer illustrated in FIG. 3.
Figure 8E:
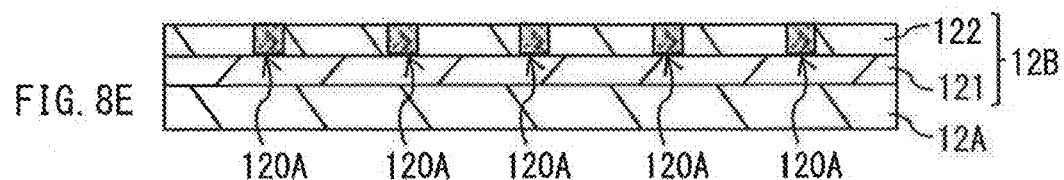
FIG. 8E illustrates an example process for manufacturing an inorganic sealing layer included in the lower sealing layer illustrated in FIG. 3.

The substrate 12A may first be prepared, as illustrated in FIG. 8A. Next, the alumina layer 121 and the SiN layer 122 may be formed in order on the substrate 12A, as illustrated in FIG. 8B. Next, a resist layer 120 having openings 120a at predetermined portions may be formed on the SiN layer 122, as illustrated in FIG. 8C. Next, plasma oxidation, for example, may be used to oxidize the SiN layer 122 at parts exposed on bottoms of the openings 120a, as illustrated in FIG. 8D. The plasma oxidation may be performed with oxidized plasma using process gas including at least oxygen, such as $O_2$, Ar and $O_2$, or Kr and $O_2$. A composition of the SiN layer 122 at the parts exposed on the bottoms of the openings 120a may thus be changed from SiN to silicon oxynitride (SiOxNy) or silicon oxide (SiOx), for example. After the composition at the parts of the SiN layer 122 has been changed, the parts may serve as the fracture control parts 120A. The inorganic sealing film 12B may thus be formed. The fracture control parts 120A being formed may extend from the upper surface of the inorganic sealing film 12B to a depth that does not reach the lower surface of the inorganic sealing film 12B. One reason for this is that the alumina layer 121 may serve as a layer that stops plasma oxidation. That is, the alumina layer 121 may control a depth of each of the fracture control parts 120A. The resist layer 120 may then be removed, as illustrated in FIG. 8E. As described above, the fracture control parts 120A may be formed in the predetermined parts of the inorganic sealing film 12B. It is possible to form the fracture control parts 120B, 150A, and 150B respectively in the SiN layers 124, 152, and 154 with a similar method to the method described above.

Next, effects of the luminescent panel 10 according to the example embodiment will now be described herein.

In typical flexible luminescent panels including organic EL elements, inorganic sealing films have been used to improve resistance to environment. Such an inorganic sealing film can accidentally fractures. A position of such a fracture is thus not controlled. When the luminescent panel is bent, stress is accordingly applied to the inorganic sealing film. This can cause a micro-crack, for example, resulting in accidental occurrence of a fracture of the inorganic sealing film. In this case, a distance of a leak path due to the fracture on the inorganic sealing film is not controlled. It has been accordingly difficult to secure reliability of the luminescent panel if the inorganic sealing film has fractured.

In the example embodiment, the inorganic sealing films 12B and 12D in the lower sealing layer 12 and the inorganic sealing films 15B and 15D in the upper sealing layer 15 are provided with the respective fracture control parts 120A, 120B, 150A, and 150B including an inorganic material having relatively lower mechanical strength, compared with other parts. The fracture control parts 120A, 120B, 150A, and 150B have relatively low breaking strength when tensile stress is applied to the inorganic sealing films 12B, 12D, 15B, and 15D. For example, in the inorganic sealing film 15B, the fracture control parts 150A may include silicon oxynitride (SiOxNy) or silicon oxide (SiOx), and other parts may include silicon nitride (SiNx). A micro-crack is accordingly likely to occur in any of the fracture control parts 120A, 120B, 150A, and 150B when stress is applied to the inorganic sealing films 12B, 12D, 15B, and 15D. In the luminescent panel 10, a fracture is thus likely to occur starting from any of the fracture control parts 120A, 120B, 150A, and 150B. In the example embodiment, as described above, the fracture control parts 120A, 120B, 150A, and 150B may control parts of the upper sealing layer 15 and the lower sealing layer 12 at which a fracture is likely to occur. Moisture would therefore be less likely to reach the organic EL elements 11B, compared with a case where parts of the sealing layer at which a fracture is likely to occur are not controlled. It is therefore possible to improve the resistance to environment, compared with a case where parts of the sealing layer at which a fracture is likely to occur are not controlled. With the fracture control parts 120A, 120B, 150A, and 150B that control parts at which a fracture is likely to occur, it is possible to secure the reliability of the luminescent panel 10.

In the example embodiment, the fracture control parts 120A and 120B are respectively provided in the lower sealing layer 12 at positions not opposed to each other in the layered direction. Similarly, the fracture control parts 150A and 150B are respectively provided in the upper sealing layer 15 at positions not opposed to each other in the layered direction. In a case where a fracture has occurred starting from any of the fracture control parts 120A and 120B, a path (leak path) along which external moisture reaches the organic EL elements 11B thus has a length corresponding to a distance between each of the fracture control parts 120A and adjacent one of the fracture control parts 120B. Similarly, in a case where a fracture has occurred starting from any of the fracture control parts 150A and 150B, a path (leak path) along which external moisture reaches the organic EL elements 11B has a length corresponding to a distance between each of the fracture control parts 150A and adjacent one of the fracture control parts 150B. As a result, the leak path extends longer, compared with a case where the fracture control parts 120A and 120B or the fracture control parts 150A and 150B are provided at positions opposed to each other in the layered direction. As the leak path extends longer, the resistance to environment improves. With the fracture control parts 120A and 120B or the fracture control parts 150A and 150B that each define a leak path, it is possible to secure the reliability of the luminescent panel 10.

In the example embodiment, the fracture control parts 120A, 120B, 150A, and 150B extend in a direction intersecting the long axis direction of the luminescent panel 10. A fracture is thus likely to occur starting from any of the fracture control parts 120A, 120B, 150A, and 150B. In the example embodiment, as described above, the fracture control parts 120A, 120B, 150A, and 150B may control parts of the lower sealing layer 12 and the upper sealing layer 15 at which a fracture is likely to occur. Moisture would therefore be less likely to reach the organic EL elements 11B, compared with a case where parts of the sealing layer at which a fracture is likely to occur are not controlled. It is therefore possible to improve the resistance to environment, compared with a case where parts of the sealing layer at which a fracture is likely to occur are not controlled. With the fracture control parts 120A, 120B, 150A, and 150B that control parts at which a fracture is likely to occur, it is possible to secure the reliability of the luminescent panel 10.

In the example embodiment, the fracture control parts 120A, 120B, 150A, and 150B are respectively formed from the upper surfaces of the inorganic sealing films 12B, 12D, 15B, and 15D to a depth that does not reach the lower surfaces of the inorganic sealing films 12B, 12D, 15B, and 15D. The alumina layers 121, 123, 151, and 153 each extend over the whole surface of the luminescent panel 10. This does not cause to degrade a function of preventing moisture, for example, from entering the EL layer 14, compared with a case where the fracture control parts 120A, 120B, 150A, and 150B respectively pass through the inorganic sealing films 12B, 12D, 15B, and 15D. It is therefore possible to secure the reliability of the luminescent panel 10.

In the example embodiment where a composition at the boundaries BD1 and BD2 has been gradually changed by selectively oxidizing the SiN layers 122 and 124 through plasma oxidation, for example, substantially no unevenness is formed on the surfaces of the SiN layers 122 and 124. This makes it possible to eliminate negative effects of the provision of the fracture control parts 120A and 120B on the TFT layer 13 and the EL layer 14.

In the example embodiment where the fracture control parts 120A, 120B, 150A, and 150B include silicon oxynitride (SiOxNy) or silicon oxide (SiOx), and other parts than the fracture control parts 120A, 120B, 150A, and 150B include silicon nitride (SiNx) in the SiN layers 122, 124, 152, and 154, a fracture is likely to occur starting from any of the fracture control parts 120A, 120B, 150A, and 150B. In the example embodiment, the fracture control parts 120A, 120B, 150A, and 150B may control parts of the upper sealing layer 15 and the lower sealing layer 12 at which a fracture is likely to occur. Moisture would therefore be less likely to reach the organic EL elements 11B, compared with a case where parts of the sealing layer at which a fracture is likely to occur are not controlled. Furthermore, the alumina layers 121, 123, 151, and 153 extending over the whole surface of the luminescent panel 10 prevent the barrier properties against moisture, for example, from being impaired. It is therefore possible to improve the resistance to environment, compared with a case where parts of the sealing layer at which a fracture is likely to occur are not controlled. With the fracture control parts 120A, 120B, 150A, and 150B that control parts at which a fracture is likely to occur, it is possible to secure the reliability of the luminescent panel 10.

In the example embodiment where the fracture control parts 120A and 120B are formed through an oxidation treatment, as described above, substantially no unevenness is formed on the surfaces of the inorganic sealing films 12B and 12D. Even though the fracture control parts 120A and 120B are provided, the TFT layer 13 and the EL layer 14 are thus not negatively affected.

In the example embodiment, the resin layer 12C is provided in the layer disposed between the inorganic sealing films 12B and 12D in the lower sealing layer 12. The resin layer 15C is provided in the layer provided between the inorganic sealing films 15B and 15D in the upper sealing layer 15. The resin layers 12C and 15C each constitute a part of a leak path in a case where a fracture has occurred in any of the fracture control parts 120A, 120B, 150A, and 150B. In a case where the resin layers 12C and 15C include a resin material containing a desiccant including a metal organic compound or an inorganic compound, for example, moisture absorbency of the resin layers 12C and 15C makes it possible to suppress moisture passing through a leak path from advancing. It is therefore possible to improve the resistance to environment, compared with a case where no resin layer is provided on a leak path.

2. Modification Examples to First Embodiment

[Modification Example A]

Figure 9:
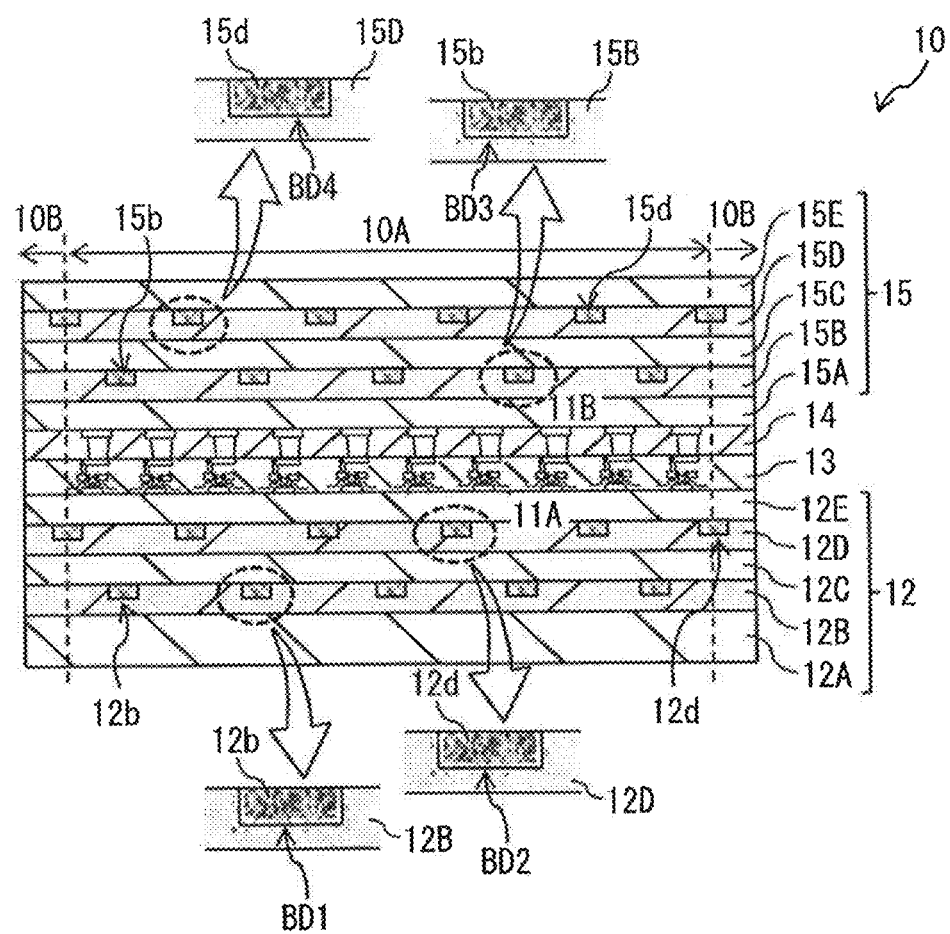
FIG. 9 is a cross-sectional view of an example configuration of the luminescent panel illustrated in FIG. 3 according to a modification example.

In Modification Example A of the example embodiment described above, the inorganic sealing film 12B may include a plurality of fracture control parts 12b in portions of a silicon nitride (SiNx) layer, and the inorganic sealing film 12D may include a plurality of fracture control parts 12d in portions of an SiNx layer, as illustrated in FIG. 9, for example.

The fracture control parts 12b may be respectively formed from the upper surface of the inorganic sealing film 12B to a depth that does not reach the lower surface of the inorganic sealing film 12B. The inorganic sealing film 12B excluding the fracture control parts 12b may therefore cover over the whole surface of the luminescent panel 10. The fracture control parts 12d may be respectively formed from the upper surface of the inorganic sealing film 12D to a depth that does not reach the lower surface of the inorganic sealing film 12D. The inorganic sealing film 12D excluding the fracture control parts 12d may therefore cover over the whole surface of the luminescent panel 10.

In Modification Example A, the luminescent panel 10 may have a rectangular shape as illustrated in FIG. 1, and the luminescent panel 10 may be bent in the longitudinal direction of the luminescent panel 10. The fracture control parts 12b and 12d of Modification Example A may extend in a direction intersecting (e.g., orthogonal to) the longitudinal direction of the luminescent panel 10. The fracture control parts 12b and 12d may include an inorganic material having relatively lower mechanical strength, compared with other parts.

In an example in which the inorganic sealing film 12B includes silicon nitride (SiNx), the fracture control parts 12b may include silicon oxynitride (SiOxNy) or silicon oxide (SiOx). In the inorganic sealing film 12B of this example, the fracture control parts 12b may include silicon oxynitride (SiOxNy) or silicon oxide (SiOx), and other parts may include silicon nitride (SiNx). Such an inorganic sealing film 12B may be formed by oxidizing some portions of a silicon nitride (SiNx) film into silicon oxynitride (SiOxNy) portions or silicon oxide (SiOx) portions, for example. In an example in which the inorganic sealing film 12D includes silicon nitride (SiNx), the fracture control parts 12d may include silicon oxynitride (SiOxNy) or silicon oxide (SiOx). In the inorganic sealing film 12D of this example, the fracture control parts 12d may include silicon oxynitride (SiOxNy) or silicon oxide (SiOx), and other parts may include silicon nitride (SiNx). Such an inorganic sealing film 12D may be formed by oxidizing some portions of a silicon nitride (SiNx) film into silicon oxynitride (SiOxNy) portions or silicon oxide (SiOx) portions, for example.

In the lower sealing layer 12, the plurality of fracture control parts 12b and the plurality of fracture control parts 12d may be provided at respective positions not opposed to each other in the layered direction. In one example embodiment, the plurality of fracture control parts 12b and the plurality of fracture control parts 12d may be disposed away from each other as far as possible, when viewed in the normal direction of the lower sealing layer 12, for example. The plurality of fracture control parts 12b and the plurality of fracture control parts 12d may be disposed at equal intervals, when viewed in the normal direction of the lower sealing layer 12, for example. In a specific but non-limiting example, a direction in which the plurality of fracture control parts 12b and the plurality of fracture control parts 12d are opposed to each other may be parallel to the bending direction, for example. In a case where the substrate 12A, the resin layer 12C, and the resin layer 12E include a resin material containing a desiccant as described above, the plurality of fracture control parts 12b and the plurality of fracture control parts 12d may be disposed away from each other at an interval of approximately 1 mm, when viewed in the normal direction of the lower sealing layer 12, for example.

Silicon nitride (SiNx) is higher in barrier properties (transmission prevention properties) against moisture, for example, compared with silicon oxynitride (SiOxNy) and silicon oxide (SiOx). Even in a case where the fracture control parts 12b and 12d are provided in the respective inorganic sealing films 12B and 12D, the silicon nitride (SiNx) layers including parts immediately below the fracture control parts 12b and 12d may accordingly keep the barrier properties (transmission prevention properties) against moisture, for example. Even in a case where a fracture is caused in any of the fracture control parts 12b and 12d in the respective inorganic sealing films 12B and 12D by bending or curving the luminescent panel 10, a route of moisture, for example, from the substrate 12A to the EL layer 14 may be longer by a distance between each of the fracture control parts 12b and adjacent one of the fracture control parts 12d, when viewed in the normal direction of the lower sealing layer 12, compared with a case where the fracture control parts 12b and 12d are provided at respective positions opposed to each other in the layered direction. It is therefore possible to improve the resistance to environment of luminescent panel 10.

At each boundary BD1 between a region in which the fracture control part 12b is provided and a region in which the fracture control part 12b is not provided, a composition may be steeply or gradually changed. The boundary at which a composition is gradually changed may be formed by selectively oxidizing the inorganic sealing film 12B through plasma oxidation, for example, so that the composition moderately changes at the boundary. Forming the fracture control parts 12b through plasma oxidation, as described above, may generate substantially no unevenness on the surface of the inorganic sealing film 12B. The provision of the fracture control parts 12b thus causes no negative effects on the TFT layer 13 and the EL layer 14.

At each boundary BD2 between a region in which the fracture control part 12d is provided and a region in which the fracture control part 12d is not provided, a composition may be steeply or gradually changed. The boundary at which a composition is gradually changed may be formed by selectively oxidizing the inorganic sealing film 12D through plasma oxidation, for example, so that the composition moderately changes at the boundary. Forming the fracture control parts 12d through plasma oxidation, as described above, may generate substantially no unevenness on the surface of the inorganic sealing film 12D. The provision of the fracture control parts 12d may thus cause no negative effects on the TFT layer 13 and the EL layer 14.

In a case where the luminescent panel 10 has a rectangular shape, as illustrated in FIG. 1, and where the bending direction of the luminescent panel 10 corresponds to the lateral direction of the luminescent panel 10, the fracture control parts 12b and 12d may extend in a direction intersecting (e.g., orthogonal to) the lateral direction of the luminescent panel 10. The fracture control parts 12b may be formed in stripes, dots, or shapes combined with stripes and dots. In a case where the fracture control parts 12b are formed in dots, an arrangement direction of the plurality of fracture control parts 12b may be parallel to the bending direction of the luminescent panel 10. The fracture control parts 12d may be formed in stripes, dots, or shapes combined with stripes and dots. In a case where the fracture control parts 12d are formed in dots, an arrangement direction of the plurality of fracture control parts 12d may be parallel to the bending direction of the luminescent panel 10.

In Modification Example A of the the example embodiment described above, the inorganic sealing film 15B may include a plurality of fracture control parts 15b in portions of a silicon nitride (SiNx) layer, and the inorganic sealing film 15D may include a plurality of fracture control parts 15d in portions of a silicon nitride (SiNx) layer, as illustrated in FIG. 9, for example.

The fracture control parts 15b may be respectively formed from the upper surface of the inorganic sealing film 15B to a depth that does not reach the lower surface of the inorganic sealing film 15B. The inorganic sealing film 15B excluding the fracture control parts 15b may therefore cover over the whole surface of the luminescent panel 10. The fracture control parts 15d may be respectively formed from the upper surface of the inorganic sealing film 15D to a depth that does not reach the lower surface of the inorganic sealing film 15D. The inorganic sealing film 15D excluding the fracture control parts 15d may therefore cover over the whole surface of the luminescent panel 10.

In Modification Example A, the luminescent panel 10 may have a rectangular shape as illustrated in FIG. 1, and the luminescent panel 10 may be bent in the longitudinal direction of the luminescent panel 10. The fracture control parts 15b and 15d of Modification Example A may extend in a direction intersecting (e.g., orthogonal to) the longitudinal direction of the luminescent panel 10. The fracture control parts 15b and 15d may include an inorganic material having relatively lower mechanical strength, compared with other parts.

In an example in which the inorganic sealing film 15B includes silicon nitride (SiNx), the fracture control parts 15b may include silicon oxynitride (SiOxNy) or silicon oxide (SiOx). In the inorganic sealing film 15B of this example, the fracture control parts 15b may include silicon oxynitride (SiOxNy) or silicon oxide (SiOx), and other parts may include silicon nitride (SiNx). Such an inorganic sealing film 15B may be formed by oxidizing some portions of a silicon nitride (SiNx) film into silicon oxynitride (SiOxNy) portions or silicon oxide (SiOx) portions, for example. In an example in which the inorganic sealing film 15D includes silicon nitride (SiNx), the fracture control parts 15d may include silicon oxynitride (SiOxNy) or silicon oxide (SiOx). In the inorganic sealing film 15D of this example, the fracture control parts 15d may include silicon oxynitride (SiOxNy) or silicon oxide (SiOx), and other parts may include silicon nitride (SiNx). Such an inorganic sealing film 15D may be formed by oxidizing some portions of a silicon nitride (SiNx) film into silicon oxynitride (SiOxNy) portions or silicon oxide (SiOx) portions for example.

In the upper sealing layer 15, the plurality of fracture control parts 15b and the plurality of fracture control parts 15d may be provided at respective positions not opposed to each other in the layered direction. In one example embodiment, the plurality of fracture control parts 15b and the plurality of fracture control parts 15d may be disposed away from each other as far as possible, when viewed in the normal direction of the upper sealing layer 15, for example.

The plurality of fracture control parts 15b and the plurality of fracture control parts 15d may be disposed at equal intervals, when viewed in the normal direction of the upper sealing layer 15, for example. In a specific but non-limiting example, a direction in which the plurality of fracture control parts 15b and the plurality of fracture control parts 15d are opposed to each other may be parallel to the bending direction, for example. In a case where the resin layer 15A, the resin layer 15C, and the resin layer 15E include a resin material containing a desiccant, as described above, the plurality of fracture control parts 15b and the plurality of fracture control parts 15d may be disposed away from each other at an interval of approximately 1 mm, when viewed in the normal direction of the upper sealing layer 15, for example.

Silicon nitride (SiNx) is higher in barrier properties (transmission prevention properties) against moisture, for example, compared with silicon oxynitride (SiOxNy) and silicon oxide (SiOx). Even in a case where the fracture control parts 15b and 15d are provided in the respective inorganic sealing films 15B and 15D, the silicon nitride (SiNx) layers including parts immediately below the fracture control parts 15b and 15d may accordingly keep the barrier properties (transmission prevention properties) against moisture, for example. Even in a case where a fracture is caused in any of the fracture control parts 15b and 15d in the respective inorganic sealing films 15B and 15D by bending or curving the luminescent panel 10, a route of moisture, for example, from the resin layer 15E to the EL layer 14 may be longer by a distance between each of the fracture control parts 15b and adjacent one of the fracture control parts 15d, when viewed in the normal direction of the upper sealing layer 15, compared with a case where the fracture control parts 15b and 15d are provided at respective positions opposed to each other in the layered direction. It is therefore possible to improve the resistance to environment of luminescent panel 10.

At each boundary BD3 between a region in which the fracture control part 15b is provided and a region in which the fracture control part 15b is not provided, a composition may be steeply or gradually changed. The boundary at which a composition is gradually changed may be formed by selectively oxidizing the inorganic sealing film 15B through plasma oxidation, for example, so that the composition moderately changes at the boundary. Forming the fracture control parts 15b through plasma oxidation, as described above, may generate substantially no unevenness on the surface of the inorganic sealing film 15B. The provision of the fracture control parts 15b thus causes no negative effects on the TFT layer 13 and the EL layer 14.

At each boundary BD4 between a region in which the fracture control part 15d is provided and a region in which the fracture control part 15d is not provided, a composition may be steeply or gradually changed. The boundary at which a composition is gradually changed may be formed by selectively oxidizing the inorganic sealing film 15D through plasma oxidation, for example, so that the composition moderately changes at the boundary. Forming the fracture control parts 15d through plasma oxidation, as described above, may generate substantially no unevenness on the surface of the inorganic sealing film 15D. The provision of the fracture control parts 15d may thus cause no negative effects on the TFT layer 13 and the EL layer 14.

In a case where the luminescent panel 10 has a rectangular shape, as illustrated in FIG. 1, and where the bending direction of the luminescent panel 10 corresponds to the lateral direction of the luminescent panel 10, the fracture control parts 15*b* and 15*d* may extend in a direction intersecting (e.g., orthogonal to) the lateral direction of the luminescent panel 10. The fracture control parts 15*b* may be formed in stripes, dots, or shapes combined with stripes and dots. In a case where the fracture control parts 15*b* are formed in dots, an arrangement direction of the plurality of fracture control parts 15*b* may be parallel to the bending direction of the luminescent panel 10. The fracture control parts 15*d* may be formed in stripes, dots, or shapes combined with stripes and dots. In a case where the fracture control parts 15*d* are formed in dots, an arrangement direction of the plurality of fracture control parts 15*d* may be parallel to the bending direction of the luminescent panel 10.

[Manufacturing Method]

Next, a manufacturing method for the fracture control parts 12*b* will now be described herein. FIGS. 10A to 10E illustrate an example process for manufacturing the inorganic sealing film 12B included in the lower sealing layer 12 of the luminescent panel 10 according to the modification example.

Figure 10A:
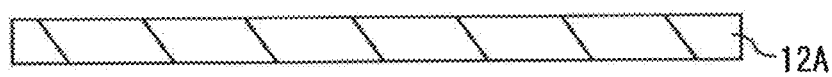
FIG. 10A illustrates an example process for manufacturing an inorganic sealing layer included in a lower sealing layer illustrated in FIG. 9.
Figure 10B:
FIG. 10B illustrates an example process for manufacturing an inorganic sealing layer included in a lower sealing layer illustrated in FIG. 9.
Figure 10C:
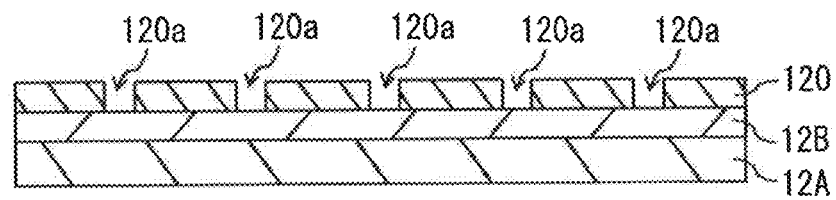
FIG. 10C illustrates an example process for manufacturing an inorganic sealing layer included in a lower sealing layer illustrated in FIG. 9.
Figure 10D:
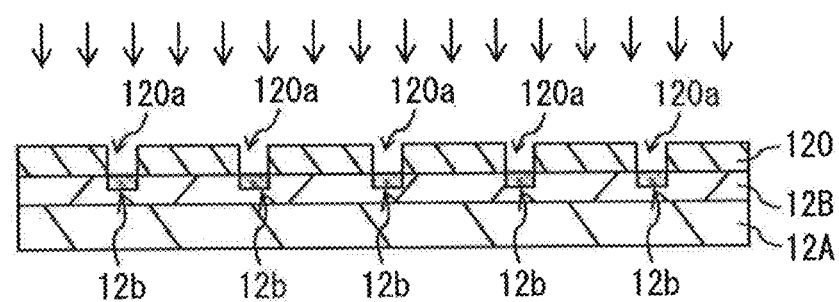
FIG. 10D illustrates an example process for manufacturing an inorganic sealing layer included in a lower sealing layer illustrated in FIG. 9.
Figure 10E:
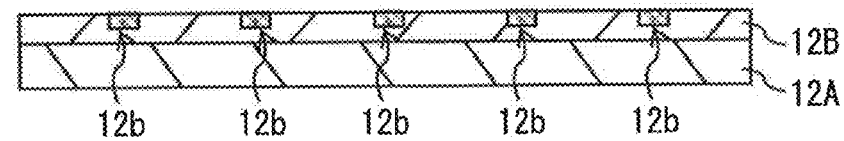
FIG. 10E illustrates an example process for manufacturing an inorganic sealing layer included in a lower sealing layer illustrated in FIG. 9.

The substrate 12A may first be prepared, as illustrated in FIG. 10A. Next, a film of silicon nitride (SiNx), for example, may be formed on the substrate 12A to form the inorganic sealing film 12B, as illustrated in FIG. 10B. Next, a resist layer 120 having openings 120*a* at predetermined portions may be formed on the inorganic sealing film 12B, as illustrated in FIG. 10C. Next, plasma oxidation, for example, may be used to oxidize the inorganic sealing film 12B at parts exposed on bottoms of the openings 120*a*, as illustrated in FIG. 10D. The plasma oxidation may be performed with oxidized plasma using process gas including at least oxygen, such as $O_2$, Ar and $O_2$, or Kr and $O_2$. A composition of the inorganic sealing film 12B at the parts exposed on the bottoms of the openings 120*a* may thus be changed from silicon nitride (SiNx) to silicon oxynitride (SiOxNy) or silicon oxide (SiOx), for example. After the composition at the parts of the inorganic sealing film 12B has been changed, the parts may serve as the fracture control parts 12*b*. The fracture control parts 12*b* being formed may extend from the upper surface of the inorganic sealing film 12B to a depth that does not reach the lower surface of the inorganic sealing film 12B, as illustrated in FIG. 10D, for example. The resist layer 120 may then be removed, as illustrated in FIG. 10E. As described above, the fracture control parts 12*b* may be formed in the predetermined parts of the inorganic sealing film 12B. It is possible to form the fracture control parts 12*d*, 15*b*, and 15*d* respectively in the inorganic sealing films 12D, 15B, and 15D with a similar method to the method described above.

Next, effects of the luminescent panel 10 according to Modification Example A will now be described herein.

In Modification Example A, the inorganic sealing films 12B and 12D in the lower sealing layer 12 and the inorganic sealing films 15B and 15D in the upper sealing layer 15 are provided with the respective fracture control parts 12*b*, 12*d*, 15*b*, and 15*d* including an inorganic material having relatively lower mechanical strength, compared with other parts. The fracture control parts 12*b*, 12*d*, 15*b*, and 15*d* have relatively low breaking strength when tensile stress is applied to the inorganic sealing films 12B, 12D, 15B, and 15D. A micro-crack is accordingly likely to occur in any of the fracture control parts 12*b*, 12*d*, 15*b*, and 15*d* when stress is applied to the inorganic sealing films 12B, 12D, 15B, and 15D. In the luminescent panel 10, a fracture is thus likely to occur starting from any of the fracture control parts 12*b*, 12*d*, 15*b*, and 15*d*. In Modification Example A, as described above, the fracture control parts 15*b* and 15*d* may control parts of the upper sealing layer 15 and the lower sealing layer 12 at which a fracture is likely to occur. Moisture would therefore be less likely to reach the organic EL elements 11B, compared with a case where parts of the sealing layer at which a fracture is likely to occur are not controlled. It is therefore possible to improve the resistance to environment, compared with a case where parts of the sealing layer at which a fracture is likely to occur are not controlled. With the fracture control parts 12*b*, 12*d*, 15*b*, and 15*d* that control parts at which a fracture is likely to occur, it is possible to secure the reliability of the luminescent panel 10.

In Modification Example A, the fracture control parts 12*b* and 12*d* are respectively provided in the lower sealing layer 12 at positions not opposed to each other in the layered direction. Similarly, the fracture control parts 15*b* and 15*d* are respectively provided in the upper sealing layer 15 at positions not opposed to each other in the layered direction. In a case where a fracture has occurred starting from any of the fracture control parts 12*b* and 12*d*, a path (leak path) along which external moisture reaches the organic EL element 11B thus has a length corresponding to a distance between each of the fracture control parts 12*b* and adjacent one of the fracture control parts 12*d*. Similarly, in a case where a fracture has occurred starting from any of the fracture control parts 15*b* and 15*d*, a path (leak path) along which external moisture reaches the organic EL element 11B thus has a length corresponding to a distance between each of the fracture control parts 15*b* and adjacent one of the fracture control parts 15*d*. As a result, the leak path extends longer, compared with a case where the fracture control parts 12*b* and 12*d* or the fracture control parts 15*b* and 15*d* are provided at respective positions opposed to each other in the layered direction. As a leak path extends longer, the resistance to environment improves. With the fracture control parts 12*b* and 12*d* or the fracture control parts 15*b* and 15*d* that each define a leak path, it is possible to secure the reliability of the luminescent panel 10.

In Modification Example A, the fracture control parts 12*b*, 12*d*, 15*b*, and 15*d* extend in a direction intersecting the long axis direction of the luminescent panel 10. A fracture is thus likely to occur starting from any of the fracture control parts 12*b*, 12*d*, 15*b*, and 15*d*. In Modification Example A, as described above, the fracture control parts 12*b*, 12*d*, 15*b*, and 15*d* may control parts of the upper sealing layer 15 and the lower sealing layer 12 at which a fracture is likely to occur. Moisture would therefore be less likely to reach the organic EL elements 11B, compared with a case where parts of the sealing layer at which a fracture is likely to occur are not controlled. It is therefore possible to improve the resistance to environment, compared with a case where parts of the sealing layer at which a fracture is likely to occur are not controlled. With the fracture control parts 12*b*, 12*d*, 15*b*, and 15*d* that control parts at which a fracture is likely to occur, it is possible to secure the reliability of the luminescent panel 10.

In Modification Example A, the fracture control parts 12*b*, 12*d*, 15*b*, and 15*d* are respectively formed from the upper surfaces of the inorganic sealing films 12B, 12D, 15B, and 15D to a depth that does not reach the lower surfaces of the inorganic sealing films 12B, 12D, 15B, and 15D. The silicon nitride (SiNx) layers each extend over the whole surface of the luminescent panel 10. This does not cause to degrade a function of preventing moisture, for example, from entering the EL layer 14, compared with a case where the fracture control parts 12*b*, 12*d*, 15*b*, and 15*d* respectively pass through the inorganic sealing films 12B, 12D, 15B, and 15D. It is therefore possible to secure the reliability of the luminescent panel 10.

In Modification Example A where a composition at the boundaries BD1 and BD2 has been gradually changed by selectively oxidizing the SiN layers 122 and 124 through plasma oxidation, for example, substantially no unevenness is formed on the surfaces of the SiN layers 122 and 124. This makes it possible to eliminate negative effects of the provision of the fracture control parts 12b and 12d on the TFT layer 13 and the EL layer 14.

In Modification Example A where the fracture control parts 12b, 12d, 15b, and 15d include silicon oxynitride (SiOxNy) or silicon oxide (SiOx), and other parts than the fracture control parts 12b, 12d, 15b, and 15d include silicon nitride (SiNx), in the inorganic sealing films 12B, 12D, 15B, and 15D, a fracture is likely to occur starting from any of the fracture control parts 12b, 12d, 15b, and 15d. In Modification Example A, the fracture control parts 12b, 12d, 15b, and 15d may control parts of the upper sealing layer 15 and the lower sealing layer 12 at which a fracture is likely to occur. Moisture would therefore be less likely to reach the organic EL elements 11B, compared with a case where parts of the sealing layer at which a fracture is likely to occur are not controlled. Furthermore, the silicon nitride (SiNx) layers extending over the whole surface of the luminescent panel 10 prevent the barrier properties against moisture, for example, from being impaired. It is therefore possible to improve the resistance to environment, compared with a case where parts of the sealing layer at which a fracture is likely to occur are not controlled. With the fracture control parts 12b, 12d, 15b, and 15d that control parts at which a fracture is likely to occur, it is possible to secure the reliability of the luminescent panel 10.

In Modification Example A where the fracture control parts 12b and 12d are formed through an oxidation treatment, as described above, substantially no unevenness is formed on the surfaces of the inorganic sealing films 12B and 12D. Even though the fracture control parts 12b and 12d are provided, the TFT layer 13 and the EL layer 14 are thus not negatively affected.

In Modification Example A, the resin layer 12C is provided in the layer provided between the inorganic sealing films 12B and 12D in the lower sealing layer 12. The resin layer 15C is provided in the layer provided between the inorganic sealing films 15B and 15D in the upper sealing layer 15. The resin layers 12C and 15C each constitute a part of a leak path in a case where a fracture has occurred in any of the fracture control parts 12b, 12d, 15b, and 15d. In a case where the resin layers 12C and 15C include a resin material containing a desiccant including a metal organic compound or an inorganic compound, for example, moisture absorbency of the resin layers 12C and 15C makes it possible to suppress moisture passing through a leak path from advancing. It is therefore possible to improve the resistance to environment, compared with a case where no resin layer is provided on a leak path.

[Modification Example B]

Figure 11:
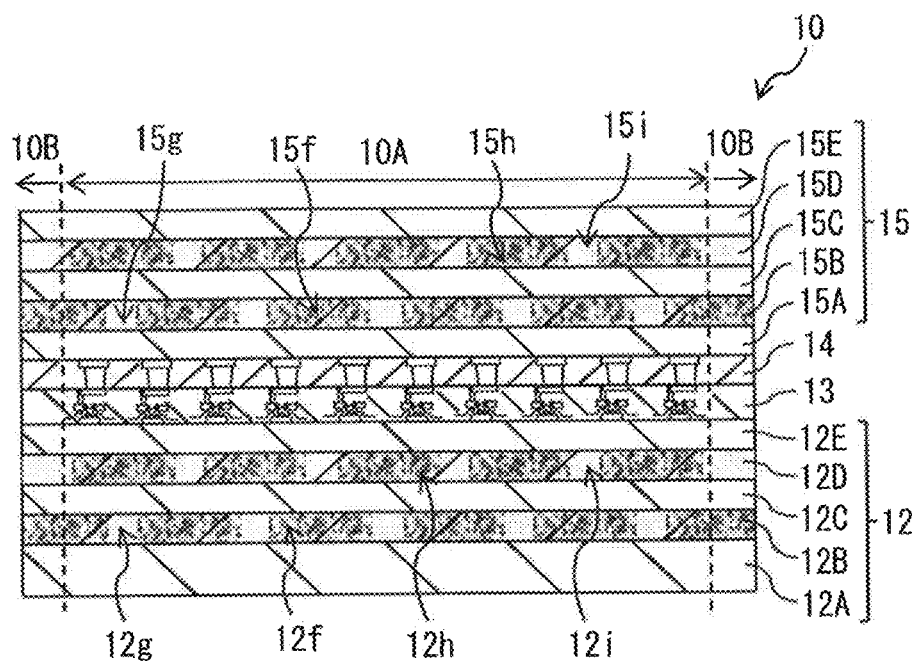
FIG. 11 is a cross-sectional view of an example configuration of the luminescent panel illustrated in FIG. 9 according to a modification example.

In Modification Example B, the inorganic sealing films 12B, 12D, 15B, and 15D may respectively include fracture control parts 12g, 12i, 15g, and 15i, instead of the fracture control parts 12b, 12d, 15b, and 15d according to Modification Example A, as illustrated in FIG. 11, for example.

Figure 12:
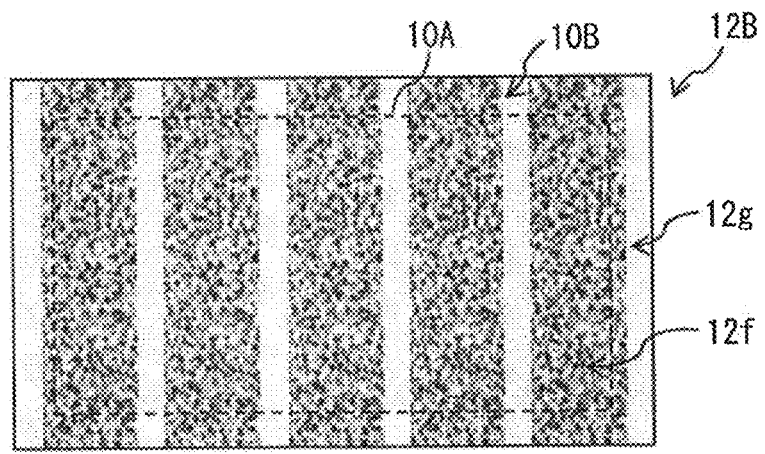
FIG. 12 is a plan view of an example configuration of an inorganic sealing layer included in a lower sealing layer illustrated in FIG. 11.

The inorganic sealing film 12B of Modification Example B may include, in other regions than regions including the fracture control parts 12g, compression stress parts 12f having relatively higher compression stress than other parts such as the fracture control parts 12g, as illustrated in FIGS. 11 and 12, for example. That is, no compression stress may be generated in the fracture control parts 12g, or compression stress generated in the fracture control parts 12g may be smaller than compression stress generated in the compression stress parts 12f. In other words, compression stress in the compression stress parts 12f in the inorganic sealing film 12B is relatively higher than compression stress in other parts.

Figure 13:
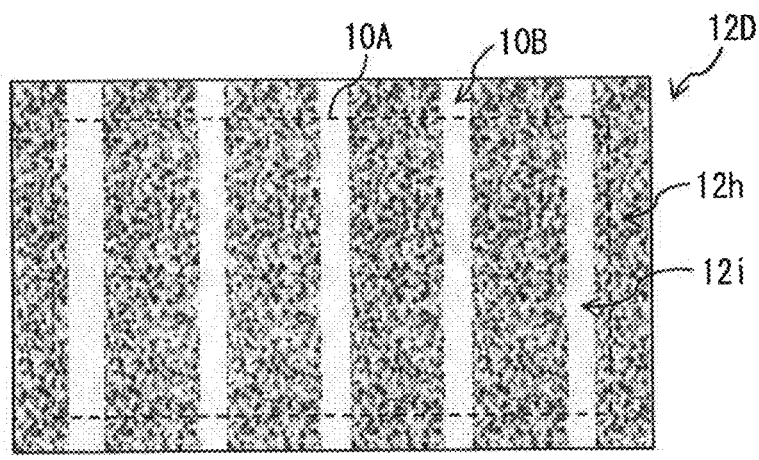
FIG. 13 is a plan view of an example configuration of the inorganic sealing layer included in the lower sealing layer illustrated in FIG. 11.

The inorganic sealing film 12D may include, in other regions than regions including the fracture control parts 12i, compression stress parts 12h having relatively higher compression stress than other parts such as the fracture control parts 12i, as illustrated in FIGS. 11 and 13, for example. That is, no compression stress may be generated in the fracture control parts 12i, or compression stress generated in the fracture control parts 12i may be smaller than compression stress generated in the compression stress parts 12h. In other words, compression stress in the compression stress parts 12h in the inorganic sealing film 12D is relatively higher than compression stress in other parts.

Figure 14:
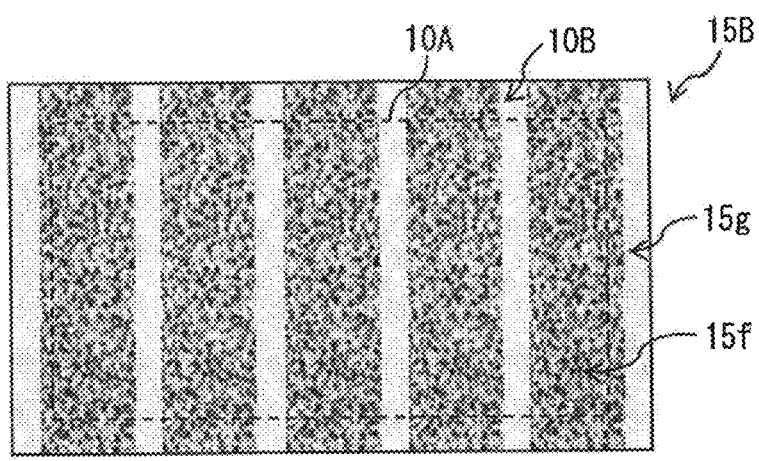
FIG. 14 is a plan view of an example configuration of an inorganic sealing layer included in an upper sealing layer illustrated in FIG. 11.

The inorganic sealing film 15B may include, in other regions than regions including the fracture control parts 15g, compression stress parts 15f having relatively higher compression stress than other parts such as the fracture control parts 15g, as illustrated in FIGS. 11 and 14, for example. That is, no compression stress may be generated in the fracture control parts 15g, or compression stress generated in the fracture control parts 15g may be smaller than compression stress generated in the compression stress parts 15f. In other words, compression stress in the compression stress parts 15f in the inorganic sealing film 15B is relatively higher than compression stress in other parts.

Figure 15:
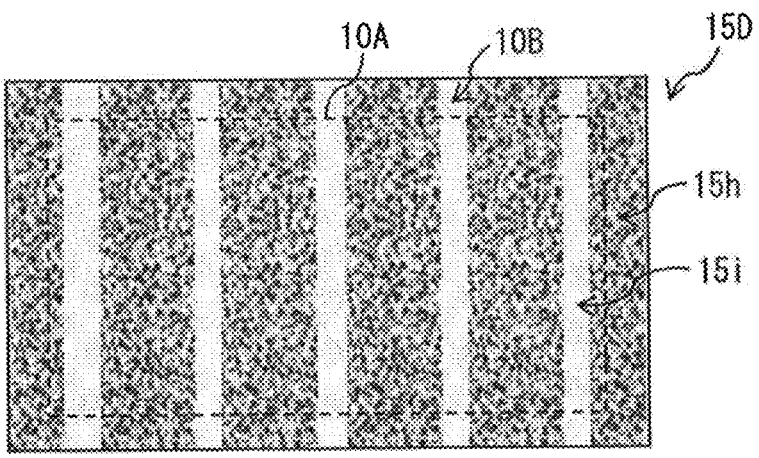
FIG. 15 is a plan view of an example configuration of the inorganic sealing layer included in the upper sealing layer illustrated in FIG. 11.

The inorganic sealing film 15D may include, in other regions than regions including the fracture control parts 15i, compression stress parts 15h having relatively higher compression stress than other parts such as the fracture control parts 15i, as illustrated in FIGS. 11 and 15, for example. That is, no compression stress may be generated in the fracture control parts 15i, or compression stress generated in the fracture control parts 15i may be smaller than compression stress generated in the compression stress parts 15h. In other words, compression stress in the compression stress parts 15h in the inorganic sealing film 15D is relatively higher than compression stress in other parts.

The compression stress parts 12f, 12h, 15f, and 15h may serve as regions introduced with impurities to have high compression stress. The compression stress parts 12f, 12h, 15f, and 15h may serve as regions introduced with ions as impurities, for example, to have high compression stress. Ions may be introduced fully from the upper surfaces to the lower surfaces of the inorganic sealing films 12B, 12D, 15B, and 15D. Ions may otherwise be introduced from the upper surfaces of the inorganic sealing films 12B, 12D, 15B, and 15D to a depth that does not reach the lower surfaces of the inorganic sealing films 12B, 12D, 15B, and 15D. In a specific but non-limiting example, such ions to be injected may be Ti, Al, Cr, or Li. One reason for this is that the ions may each have a greater radius of covalent bonding than a radius of covalent bonding of oxygen (66 pm). For example, a radius of covalent bonding of Ti is 160 pm. A radius of covalent bonding of Al is 121 pm. A radius of covalent bonding of Cr is 139 pm. A radius of covalent bonding of Li is 128 pm. Another reason for this is that, as the ions are injected, oxygen may be removed from $SiO_2$, and the ions may then be stabilized.

At each boundary between a region in which the compression stress part 12*f*, 12*h*, 15*f*, or 15*h* is provided and a region in which the compression stress part 12*f*, 12*h*, 15*f*, or 15*h* is not provided, such as the fracture control parts 12*g*, 12*i*, 15*g*, and 15*i*, a composition may be steeply or gradually changed.

Forming the inorganic sealing films 12B and 12D through introduction of ions, as described above, may generate substantially no unevenness on the surfaces of the inorganic sealing films 12B and 12D. The provision of the compression stress parts 12*f* and 12*h* thus causes no negative effects on the TFT layer 13 and the EL layer 14.

At the parts applied with relatively high compression stress, such as the compression stress parts 12*f*, 12*h*, 15*f*, and 15*h*, breaking strength is relatively high when tensile stress is applied thereto. In other words, at the parts applied with no compression stress or relatively low compression stress, such as the fracture control parts 12*g*, 12*i*, 15*g*, and 15*i*, breaking strength is relatively low when tensile stress is applied thereto. A micro-crack is accordingly likely to occur in any of the fracture control parts 12*g*, 12*i*, 15*g*, and 15*i* when stress is applied to the inorganic sealing films 12B, 12D, 15B, and 15D. A fracture is thus likely to occur starting from any of the fracture control parts 12*g*, 12*i*, 15*g*, and 15*i*. In Modification Example B, as described above, the fracture control parts 12*g*, 12*i*, 15*g*, and 15*i* may control parts of the upper sealing layer 15 and the lower sealing layer 12 at which a fracture is likely to occur. Moisture would therefore be less likely to reach the organic EL elements 11B, compared with a case where parts of the sealing layer at which a fracture is likely to occur are not controlled. It is therefore possible to improve the resistance to environment, compared with a case where parts of the sealing layer at which a fracture is likely to occur are not controlled. With the fracture control parts 12*g*, 12*i*, 15*g*, and 15*i* that control parts at which a fracture is likely to occur, it is possible to secure the reliability of the luminescent panel 10.

In the luminescent panel 10 according to Modification Example B, the resin layer 12C is provided in the layer provided between the inorganic sealing films 12B and 12D in the lower sealing layer 12. The resin layer 15C is provided in the layer provided between the inorganic sealing films 15B and 15D in the upper sealing layer 15. The resin layers 12C and 15C each constitute a part of a leak path in a case where a fracture has occurred in any of the fracture control parts 12*g*, 12*i*, 15*g*, and 15*i*. In a case where the resin layers 12C and 15C include a resin material containing a desiccant including a metal organic compound or an inorganic compound, for example, moisture absorbency of the resin layers 12C and 15C makes it possible to suppress moisture passing through a leak path from advancing. It is therefore possible to improve the resistance to environment, compared with a case where no resin layer is provided on a leak path.

[Modification Example C]

Figure 16:
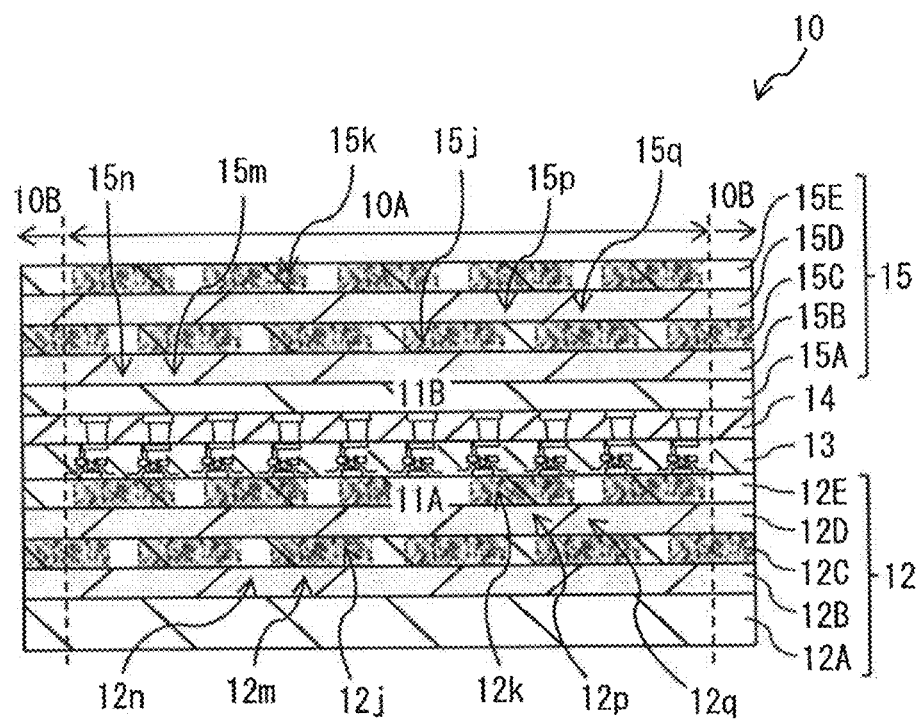
FIG. 16 is a cross-sectional view of an example configuration of the luminescent panel illustrated in FIG. 9 according to a modification example.
Figure 17:
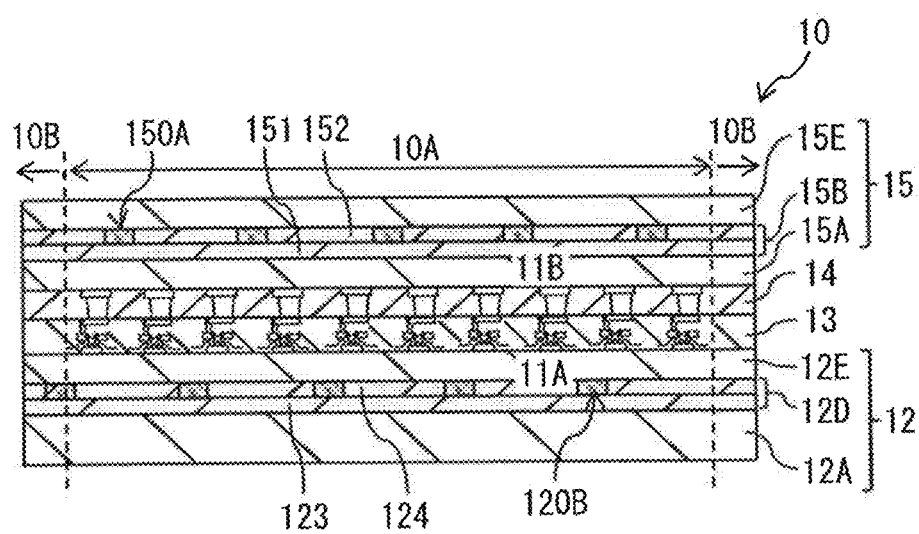
FIG. 17 is a cross-sectional view of an example configuration of the luminescent panel illustrated in FIG. 3 according to a modification example.
Figure 18:
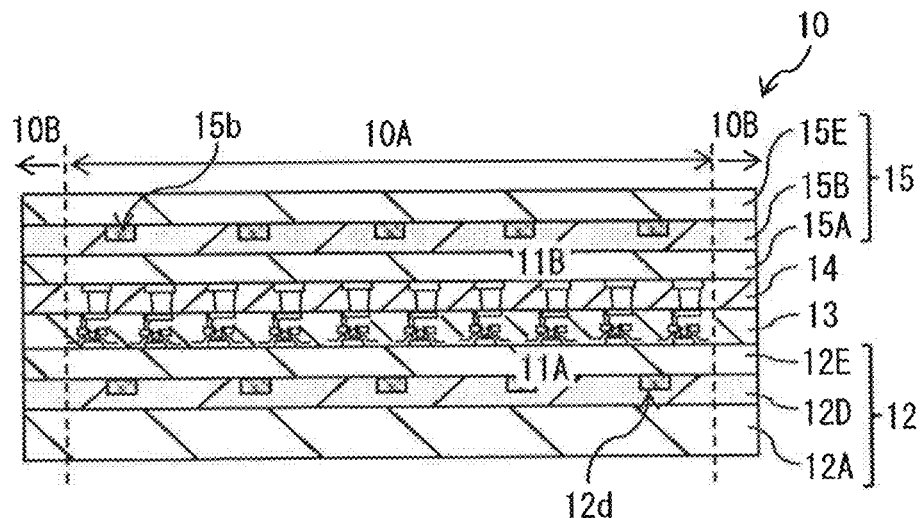
FIG. 18 is a cross-sectional view of an example configuration of the luminescent panel illustrated in FIG. 9 according to a modification example.
Figure 19:
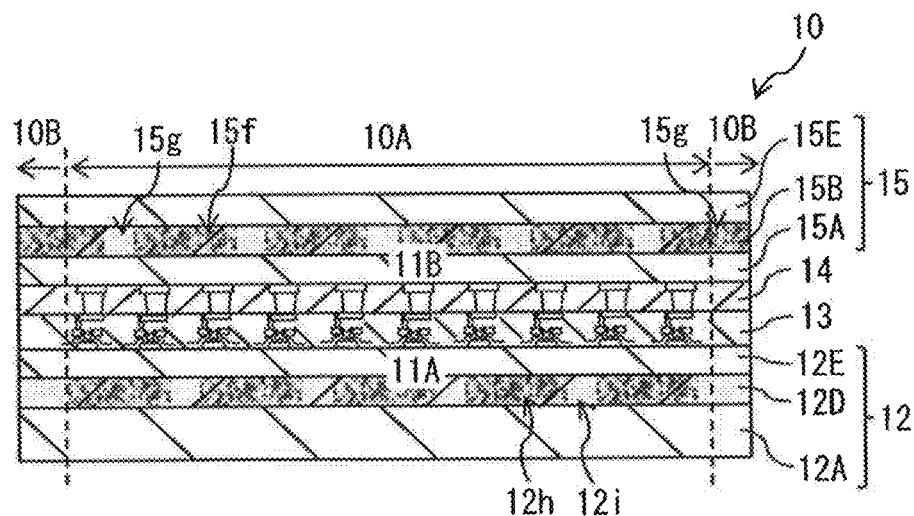
FIG. 19 is a cross-sectional view of an example configuration of the luminescent panel illustrated in FIG. 11 according to a modification example.
Figure 20:
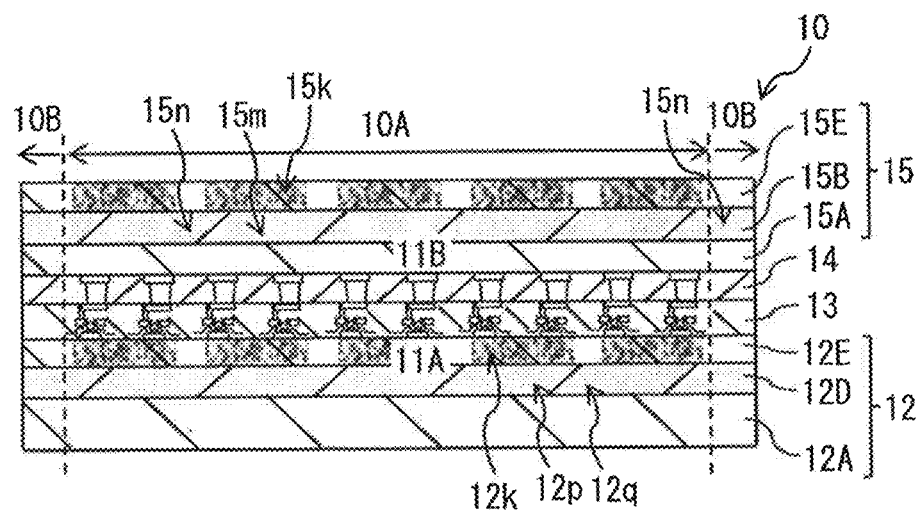
FIG. 20 is a cross-sectional view of an example configuration of the luminescent panel illustrated in FIG. 16 according to a modification example.

In Modification Example C, the inorganic sealing films 12B, 12D, 15B, and 15D may respectively include fracture control parts 12*n*, 12*q*, 15*n*, and 15*q*, instead of the fracture control parts 12*b*, 12*d*, 15*b*, and 15*d* according to Modification Example A, as illustrated in FIG. 16, for example.

In Modification Example C, the inorganic sealing film 12B may include compression stress parts 12*m* in other parts than the fracture control parts 12*n*. The inorganic sealing film 12D may include compression stress parts 12*p* in other parts than the fracture control parts 12*q*. The inorganic sealing film 15B may include compression stress parts 15*m* in other parts than the fracture control parts 15*n*. The inorganic sealing film 15D may include compression stress parts 15*p* in other parts than the fracture control parts 15*q*.

Furthermore, the resin layer 12C may include contraction parts 12*j* in contact with the respective compression stress parts 12*m*. The resin layer 12E may include contraction parts 12*k* in contact with the respective compression stress parts 12*p*. The resin layer 15C may include contraction parts 15*j* in contact with the respective compression stress parts 15*m*. The resin layer 15E may include contraction parts 15*k* in contact with the respective compression stress parts 15*p*.

That is, the lower sealing layer 12 according to Modification Example C may include the resin layer 12C (the contraction parts 12*j*) that selectively applies compression stress to predetermined parts (the compression stress parts 12*m*) of the inorganic sealing film 12B. The contraction parts 12*j* may thus apply compression stress to the compression stress parts 12*m* of the inorganic sealing film 12B. For example, after a resin layer is formed on the inorganic sealing film 12B, predetermined parts of the resin layer may be selectively irradiated with light. This may cause the parts irradiated with light to contract, resulting in the contraction parts 12*j*. While contracting, the contraction parts 12*j* may apply compression stress to parts of the inorganic sealing film 12B. As a result, the compression stress parts 12*m* may be formed in the inorganic sealing film 12B.

The lower sealing layer 12 may further include the resin layer 12E (the contraction parts 12*k*) that selectively applies compression stress to predetermined parts (the compression stress parts 12*p*) of the inorganic sealing film 12D. The resin layer 12E may thus apply compression stress to the compression stress parts 12*p* of the inorganic sealing film 12D. For example, after a resin layer is formed on the inorganic sealing film 12D, predetermined parts of the resin layer may be selectively irradiated with light. This may cause the parts irradiated with light to contract, resulting in the contraction parts 12*k*. While contracting, the contraction parts 12*k* may apply compression stress to parts of the inorganic sealing film 12D. As a result, the compression stress parts 12*p* may be formed in the inorganic sealing film 12D.

The upper sealing layer 15 may include the resin layer 15C (the contraction parts 15*j*) that selectively applies compression stress to predetermined parts (the compression stress parts 15*m*) of the inorganic sealing film 15B. The resin layer 15C may thus apply compression stress to the compression stress parts 15*m* of the inorganic sealing film 15B. For example, after a resin layer is formed on the inorganic sealing film 15B, predetermined parts of the resin layer may be selectively irradiated with light. This may cause the parts irradiated with light to contract, resulting in the contraction parts 15*j*. While contracting, the contraction parts 15*j* may apply compression stress to parts of the inorganic sealing film 15B. As a result, the compression stress parts 15*m* may be formed in the inorganic sealing film 15B.

The upper sealing layer 15 may further include the resin layer 15E (the contraction parts 15*k*) that selectively applies compression stress to predetermined parts (the compression stress parts 15*p*) of the inorganic sealing film 15D. The resin layer 15E may thus apply compression stress to the compression stress parts 15*p* of the inorganic sealing film 15D. For example, after a resin layer is formed on the inorganic sealing film 15D, predetermined parts of the resin layer may be selectively irradiated with light. This may cause the parts irradiated with light to contract, resulting in the contraction parts 15*k*. While contracting, the contraction parts 15*k* may apply compression stress to parts of the inorganic sealing film 15D. As a result, the compression stress parts 15*p* may be formed in the inorganic sealing film 15D.

At boundaries respectively between regions in which the compression stress parts 12*m*, 12*p*, 15*m*, and 15*p* are provided and regions in which the compression stress parts 12*m*, 12*p*, 15*m*, and 15*p*, i.e., the fracture control parts 12*n*, 12*q*, 15*n*, and 15*q* are not provided, no composition may be changed. The boundaries would accordingly be less likely to cause the inorganic sealing films 12B, 12D, 15B, and 15D to fracture. The difference in compression stress therefore makes it possible to easily control fracture of the inorganic sealing films 12B, 12D, 15B, and 15D.

With the compression stress parts 12*m* and 12*p* formed as a result of actions of the contraction parts 12*j* and 12*k*, there may be substantially no unevenness formed on the surface of the lower sealing layer 12. Even though the compression stress parts 12*m*, 12*p*, 15*m*, and 15*p* are provided, the TFT layer 13 and the EL layer 14 are thus not negatively affected.

At the parts applied with relatively high compression stress, such as the compression stress parts 12*m*, 12*p*, 15*m*, and 15*p*, breaking strength is relatively high when tensile stress is applied thereto. In other words, at the parts applied with no compression stress or relatively low compression stress, such as the fracture control parts 12*n*, 12*q*, 15*n*, and 15*q*, breaking strength is relatively low when tensile stress is applied thereto. A micro-crack is accordingly likely to occur in any of the fracture control parts 12*n*, 12*q*, 15*n*, and 15*q* when stress is applied to the inorganic sealing films 12B, 12D, 15B, and 15D. A fracture is thus likely to occur starting from any of the fracture control parts 12*n*, 12*q*, 15*n*, and 15*q*. In Modification Example C, as described above, the fracture control parts 12*n*, 12*q*, 15*n*, and 15*q* may control parts of the upper sealing layer 15 and the lower sealing layer 12 at which a fracture is likely to occur. Moisture would therefore be less likely to reach the organic EL elements 11B, compared with a case where parts of the sealing layer at which a fracture is likely to occur are not controlled. It is therefore possible to improve the resistance to environment, compared with a case where parts of the sealing layer at which a fracture is likely to occur are not controlled. With the fracture control parts 12*n*, 12*q*, 15*n*, and 15*q* that control parts at which a fracture is likely to occur, it is possible to secure the reliability of the luminescent panel 10.

In the luminescent panel 10 according to Modification Example C, the resin layer 12C is provided in the layer provided between the inorganic sealing films 12B and 12D in the lower sealing layer 12. The resin layer 15C is provided in the layer provided between the inorganic sealing films 15B and 15D in the upper sealing layer 15. The resin layers 12C and 15C each constitute a part of a leak path in a case where a fracture has occurred in any of the fracture control parts 12*n*, 12*q*, 15*n*, and 15*q*. In a case where the resin layers 12C and 15C each include a resin material containing a desiccant including a metal organic compound or an inorganic compound, for example, moisture absorbency of the resin layers 12C and 15C makes it possible to suppress moisture passing through a leak path from advancing. It is therefore possible to improve the resistance to environment, compared with a case where no resin layer is provided on a leak path.

[Modification Example D]

In Modification Example D, the inorganic sealing film 12B and the resin layer 12C according to the example embodiment and Modification Examples A, B, and C described above may be omitted in the lower sealing layers 12, as illustrated in FIGS. 17, 18, 19, and 20, for example. That is, the lower sealing layer 12 according to Modification Example D may be a laminate of the inorganic sealing film 12D and the resin layer 12E stacked in order on the substrate 12A. Furthermore, in Modification Example D, the resin layer 15C and the inorganic sealing film 15D may be omitted in the upper sealing layers 15 according to the example embodiment and Modification Examples A, B, and C described above, as illustrated in FIGS. 17, 18, 19, and 20, for example. That is, the upper sealing layer 15 according to the modification example may be a laminate of the inorganic sealing film 15B and the resin layer 15E stacked in order on the resin layer 15A.

In Modification example D, as the example embodiment and Modification Examples A, B, and C described above, the fracture control parts 12*d*, 12*i*, 12*q*, 15*b*, 15*g*, 15*n*, 120B, and 150A may control parts of the lower sealing layer 12 and the upper sealing layer 15 at which a fracture is likely to occur. Moisture would therefore be less likely to reach the organic EL elements 11B, compared with a case where parts of the sealing layer at which a fracture is likely to occur are not controlled. It is therefore possible to improve the resistance to environment, compared with a case where parts of the sealing layer at which a fracture is likely to occur are not controlled. With the fracture control parts 12*d*, 12*i*, 12*q*, 15*b*, 15*g*, 15*n*, 120B, and 150A that control parts at which a fracture is likely to occur, it is possible to secure the reliability of the luminescent panel 10.

[Modification Example E]

In Modification Example E, the inorganic sealing films 12B and 12D may be omitted in the lower sealing layer 12 according to the example embodiment and Modification Examples A to D described above. Furthermore, in Modification Example E, the inorganic sealing films 15B and 15D according to the example embodiment and Modification Examples A to D described above may be omitted in the upper sealing layer 15.

3. Second Embodiment

[Configuration]

Figure 21:
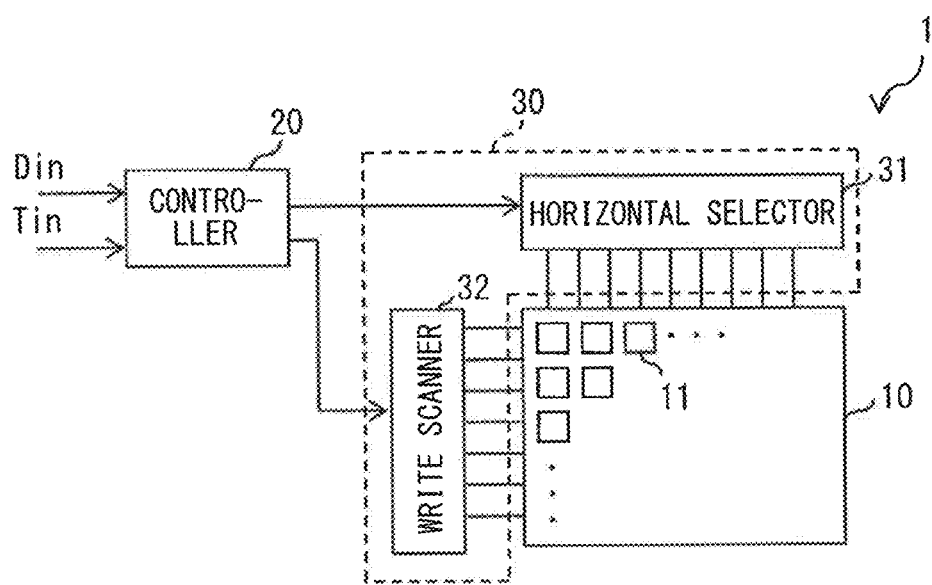
FIG. 21 is a schematic view of an example configuration of a luminescent device according to one example embodiment of the disclosure.

FIG. 21 illustrates an example schematic configuration of the luminescent device 1 according to a second embodiment of the disclosure. The luminescent device 1 may include the luminescent panel 10, the controller 20, and the driver 30, for example. The luminescent panel 10 may be one of the luminescent panels 10 according to the example embodiment and Modification Examples A to E described above. The driver 30 may be mounted on an outer edge of the luminescent panel 10. The controller 20 and the driver 30 may drive the luminescent panel 10 on the basis of an image signal Din and a synchronization signal Tin entered externally.

As the controller 20 and the driver 30 drive the pixels 11 in an active matrix manner, the luminescent panel 10 may display an image based on the image signal Din and the synchronization signal Tin entered externally.

The signal lines DTL may be each coupled to an output end of a horizontal selector 31, described later, and the source or the drain of the switching transistor Tr2. The scanning lines WSL may be each coupled to an output end of a write scanner 32, described later and the gate of the switching transistor Tr2. The power lines DSL may be each coupled to an output end of a power source circuit provided in the controller 20 and the source or the drain of the driving transistor Tr1.

The driver 30 may include the horizontal selector 31 and the write scanner 32, for example. In accordance with and in synchronization with a control signal entered from the controller 20, for example, the horizontal selector 31 may apply an analog signal voltage corresponding to the entered control signal to each of the signal lines DTL. The write scanner 32 may scan the plurality of pixels 11 per predetermined unit.

Next, the controller 20 will now be described. The controller 20 may perform a predetermined correction on the digital image signal Din entered externally to generate a signal voltage on the basis of an image signal obtained through the predetermined correction, for example. The controller 20 may output the generated signal voltage to the horizontal selector 31, for example. In accordance with and in synchronization with the synchronization signal Tin entered externally, the controller 20 may output the control signal to circuitry in the driver 30, for example.

[Effects]

In the second embodiment, the luminescent panel 10 may be one of the luminescent panels 10 according to the example embodiment and Modification Examples A to E described above. It is therefore possible to achieve the luminescent device 1 with superior resistance to environment.

4. Application Examples

Application Example 1

An application example of the luminescent device 1 according to the second embodiment described above will now be described herein. The luminescent device 1 may be applied to a display device for electronic apparatuses in various fields that displays an image or a video on the basis of image signals entered externally or image signals generated internally. Non-limiting examples of the display devices may include television sets, digital cameras, laptop personal computers, sheet-shaped personal computers, portable terminals including mobile phones, and video cameras.

Figure 22:
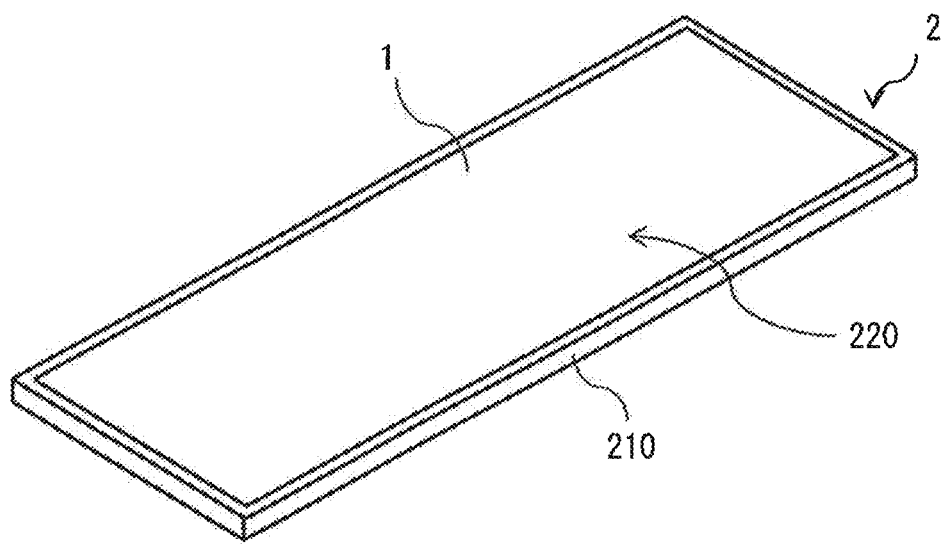
FIG. 22 is a perspective view of an example appearance of an electronic apparatus including the luminescent device according to one example embodiment described above.

FIG. 22 is a perspective view of the electronic apparatus 2 according to the application example. The electronic apparatus 2 may be a sheet-shaped personal computer including a display face 220 on a main surface of a body 210, for example. The electronic apparatus 2 may include the luminescent device 1 according to the second embodiment described above on the display face 220 of the electronic apparatus 2. The luminescent device 1 may be disposed to allow the luminescent panel 10 to face outward. In the application example, the luminescent device 1 may be provided on the display face 220. It is thus possible to achieve the electronic apparatus 2 with superior resistance to environment.

Application Example 2

Next, an application example of one of the luminescent panels 10 according to the first embodiment and Modification Examples A to E described above will now be described herein. The luminescent panels 10 according to the first embodiment and Modification Examples A to E described above may be applied to light sources for lighting apparatuses in various fields. Non-limiting examples of the lighting apparatuses may include desktop lighting apparatuses, floor lighting apparatuses, and interior lighting apparatuses.

Figure 23:
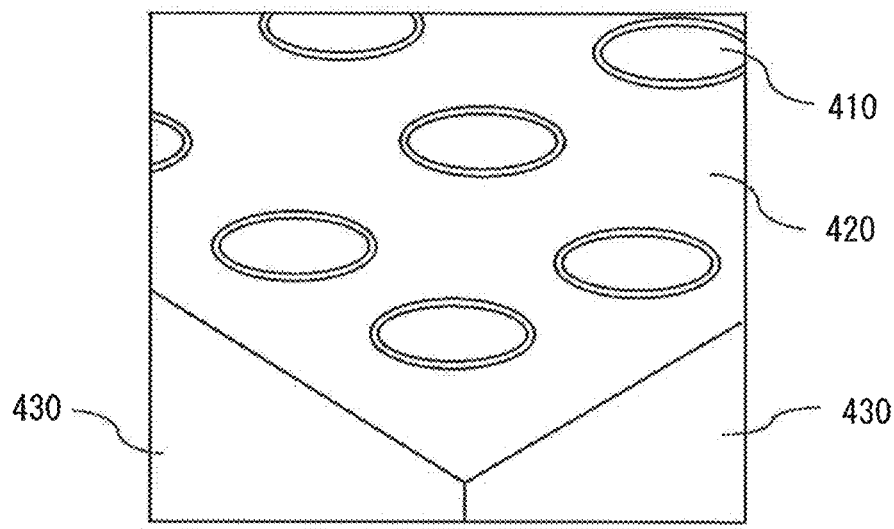
FIG. 23 is a perspective view of an example appearance of a lighting apparatus including the luminescent panel according to one example embodiment or one modification example.

FIG. 23 illustrates an appearance of an interior lighting apparatus provided with one of the luminescent panels 10 according to the first embodiment and Modification Examples A to E described above. The lighting apparatus may include, for example, the illumination part 410. The illumination part 410 may include, for example, one of the luminescent panels 10 according to the first embodiment and Modification Examples A to E described above, and a drive part that drives the luminescent panel 10. A required number of the illumination parts 410 may be disposed at appropriate intervals on a ceiling 420 of a building. The illumination parts 410 may be disposed on any locations, such as a wall 430 and a floor, in addition to the ceiling 420, in accordance with the intended use. Note that the floor is not illustrated in the drawings.

Such lighting apparatuses may cause one of the luminescent panels 10 according to the first embodiment and Modification examples A to E described above to emit light. It is therefore possible to achieve a lighting apparatus with superior resistance to environment.

Figure 24:
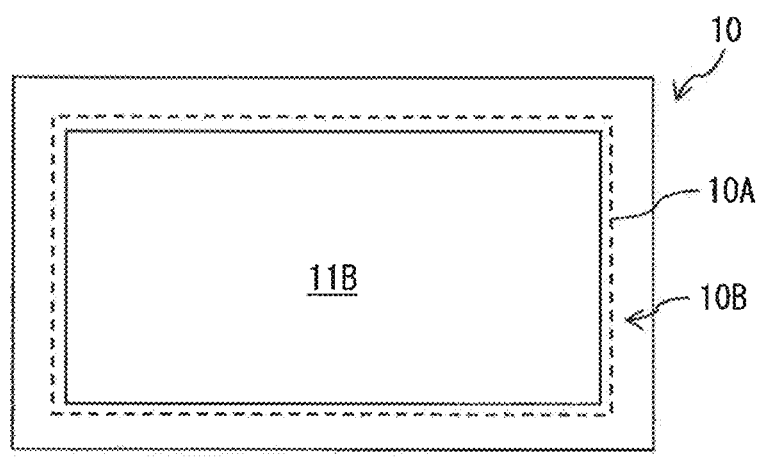
FIG. 24 is a plan view of a modified example configuration of the luminescent panel according to one example embodiment or one modification example.

In the luminescent panels 10 according to the first embodiment and Modification Examples A to E described above, how the luminescent region 10A emits light may solely depend on light emitted from the single organic EL elements 118, as illustrated in FIG. 24, for example. In a specific but non-limiting example, one of the luminescent panels 10 described above may be used as a light source of the illumination part 410.

Although the technology has been described with reference to the example embodiments, the modification examples, and the application examples, the technology is not limited thereto, but may be modified in a wide variety of ways. It should be appreciated that the effects described herein are mere examples. Effects of an example embodiment of the technology are not limited to those described herein. The technology may further include any effect other than those described herein.

Furthermore, the technology encompasses any possible combination of some or all of the various embodiments and the modifications described herein and incorporated herein.

It is possible to achieve at least the following configurations from the above-described example embodiments of the technology.

(1) A luminescent panel including:
 an upper sealing layer;
 a lower sealing layer; and
 an organic electroluminescent layer provided between the upper sealing layer and the lower sealing layer, the organic electroluminescent layer including one or a plurality of organic electroluminescent elements,
 at least one of the upper sealing layer or the lower sealing layer including one or a plurality of inorganic sealing films each provided with a plurality of fracture control parts, the fracture control parts each including an inorganic material having relatively lower mechanical strength than parts of the one or plurality of inorganic sealing films other than the fracture control parts.

(2) The luminescent panel according to (1), in which the fracture control parts each extend from an upper surface of the one or plurality of inorganic sealing films to a depth that does not reach a lower surface of the one or plurality of inorganic sealing films.

(3) The luminescent panel according to (1) or (2), in which, in the one or plurality of inorganic sealing films, a composition is gradually changed at each boundary between a region in which one of the fracture control part is provided and a region in which one of the fracture control part is not provided.

(4) The luminescent panel according to any one of (1) to (3), in which
 the one or plurality of inorganic sealing films is each a composite layer including an alumina layer and a silicon nitride layer, and the fracture control parts comprise parts of the silicon nitride layer being oxidized.

(5) The luminescent panel according to (4), in which the fracture control parts include silicon oxynitride or silicon oxide.

(6) The luminescent panel according to any one of (1) to (3), in which the fracture control parts of the one or plurality of inorganic sealing films includes silicon oxynitride or silicon oxide, and parts of the one or plurality of inorganic sealing films other than the fracture control parts include silicon nitride.

(7) The luminescent panel according to any one of (1) to (6), in which the at least one of the upper sealing layer or the lower sealing layer includes a resin layer containing a desiccant.

(8) A luminescent panel including:
an upper sealing layer;
a lower sealing layer; and
an organic electroluminescent layer provided between the upper sealing layer and the lower sealing layer, the organic electroluminescent layer including one or a plurality of organic electroluminescent elements,
at least one of the upper sealing layer or the lower sealing layer including one or a plurality of inorganic sealing films each provided with a plurality of compression stress parts, the compression stress parts having relatively higher compression stress than parts of the one or plurality of inorganic sealing films other than the compression stress parts.

(9) The luminescent panel according to (8), in which the compression stress parts comprise regions introduced with impurities to have high compression stress.

(10) The luminescent panel according to (9), in which the compression stress parts are regions introduced with ions as impurities to have high compression stress.

(11) The luminescent panel according to any one of (8) to (10), in which the at least one of the upper sealing layer or the lower sealing layer includes a resin layer containing a desiccant.

(12) A luminescent panel including:
an upper sealing layer;
a lower sealing layer; and
an organic electroluminescent layer provided between the upper sealing layer and the lower sealing layer and including one or a plurality of organic electroluminescent elements;
at least one of the upper sealing layer or the lower sealing layer including
one or a plurality of inorganic sealing films, and
one or a plurality of resin layers each provided in corresponding one of the one or plurality of inorganic sealing films to selectively apply compression stress to predetermined parts of the corresponding one of the one or plurality of inorganic sealing films.

(13) The luminescent panel according to (12), in which the one or plurality of resin layers each includes contraction parts that selectively apply compression stress to predetermined parts of the corresponding one of the one or plurality of inorganic sealing films.

(14) The luminescent panel according to (12) or (13), in which the one or plurality of resin layers contains a desiccant.

(15) A luminescent device including:
a luminescent panel; and
a drive part that drives the luminescent panel,
the luminescent panel including
an upper sealing layer,
a lower sealing layer, and
an organic electroluminescent layer provided between the upper sealing layer and the lower sealing layer and including one or a plurality of organic electroluminescent elements,
at least one of the upper sealing layer or the lower sealing layer including one or a plurality of inorganic sealing films each provided with a plurality of fracture control parts, the fracture control parts each including an inorganic material having relatively lower mechanical strength than parts of the one or plurality of inorganic sealing films other than the fracture control parts.

(16) A luminescent device including:
a luminescent panel; and
a drive part that drives the luminescent panel,
the luminescent panel including
an upper sealing layer,
a lower sealing layer, and
an organic electroluminescent layer provided between the upper sealing layer and the lower sealing layer and including one or a plurality of organic electroluminescent elements,
at least one of the upper sealing layer or the lower sealing layer including one or a plurality of inorganic sealing films each provided with a plurality of compression stress parts, the compression stress parts each having higher compression stress than parts of the one or plurality of inorganic sealing films other than the compression stress parts.

(17) A luminescent device comprising:
a luminescent panel; and
a drive part that drives the luminescent panel,
the luminescent panel including
an upper sealing layer,
a lower sealing layer, and
an organic electroluminescent layer provided between the upper sealing layer and the lower sealing layer and including one or a plurality of organic electroluminescent elements,
at least one of the upper sealing layer or the lower sealing layer including
one or a plurality of inorganic sealing films, and
one or a plurality of resin layers each provided in corresponding one of the one or plurality of inorganic sealing films to selectively apply compression stress to predetermined parts of the corresponding one of the one or plurality of inorganic sealing films.

(18) An electronic apparatus comprising a luminescent device, the luminescent device including
a luminescent panel, and
a drive part that drives the luminescent panel,
the luminescent panel including
an upper sealing layer,
a lower sealing layer, and
an organic electroluminescent layer provided between the upper sealing layer and the lower sealing layer and including one or a plurality of organic electroluminescent elements,
at least one of the upper sealing layer or the lower sealing layer including one or a plurality of inorganic sealing films each provided with a plurality of fracture control parts, the fracture control parts each including an inorganic material having relatively lower mechanical strength than parts of the one or plurality of inorganic sealing films other than the fracture control parts.

(19) An electronic apparatus comprising a luminescent device, the luminescent device including
a luminescent panel, and
a drive part that drives the luminescent panel,
the luminescent panel including
an upper sealing layer,
a lower sealing layer, and
an organic electroluminescent layer provided between the upper sealing layer and the lower sealing layer and including one or a plurality of organic electroluminescent elements,
at least one of the upper sealing layer or the lower sealing layer including one or a plurality of inorganic sealing films each provided with a plurality of compression stress parts, the compression stress parts each having relatively higher compression stress than parts of the one or plurality of inorganic sealing films other than the compression stress parts.

(20) An electronic apparatus comprising a luminescent device, the luminescent device including
a luminescent panel, and
a drive part that drives the luminescent panel,
the luminescent panel including
an upper sealing layer,
a lower sealing layer, and
an organic electroluminescent layer provided between the upper sealing layer and the lower sealing layer and including one or a plurality of organic electroluminescent elements,
at least one of the upper sealing layer or the lower sealing layer including
one or a plurality of inorganic sealing films, and
one or a plurality of resin layers each provided in corresponding one of the one or plurality of inorganic sealing films to selectively apply compression stress to predetermined parts of the corresponding one of the one or plurality of inorganic sealing films.

In the luminescent panel according to the first aspect of the disclosure, the one or plurality of inorganic sealing films is formed with the plurality of fracture control parts. The plurality of fracture control parts controls parts of the sealing layer(s) at which a fracture is likely to occur. Moisture would therefore be less likely to reach the organic electroluminescent elements, compared with a case where parts of the sealing layer(s) at which a fracture is likely to occur are not controlled.

In the luminescent panel according to the second aspect of the disclosure, the one or plurality of inorganic sealing films is formed with the plurality of compression stress parts. In other regions than regions including the compression stress parts in the one or plurality of inorganic sealing films, no compression stress is thus generated, or generated compression stress is thus smaller than compression stress generated in the compression stress parts. The other regions will be hereinafter referred to as "low compression stress parts". As a result, the low compression stress parts control parts of the sealing layer(s) at which a fracture is likely to occur. Moisture would therefore be less likely to reach the organic electroluminescent elements, compared with a case where parts of the sealing layer(s) at which a fracture is likely to occur are not controlled.

In the luminescent panel according to the third aspect of the disclosure, the one or plurality of resin layers is provided to apply compression stress to predetermined parts of any of the one or plurality of inorganic sealing films. In other regions than regions including parts applied with compression stress from the one or plurality of resin layers in the one or plurality of inorganic sealing films, no compression stress is thus generated, or generated compression stress is thus smaller than compression stress generated in the compression stress parts. The other regions will be hereinafter referred to as "low compression stress parts". As a result, the low compression stress parts control parts of the sealing layer(s) at which a fracture is likely to occur. Moisture would therefore be less likely to reach the organic electroluminescent elements, compared with a case where parts of the sealing layer(s) at which a fracture is likely to occur are not controlled.

With the luminescent panels according to the first, second, and third aspects, the luminescent devices according to the fourth, fifth, and sixth aspects, and the electronic apparatuses according to the seventh, eighth, and ninth aspects of the disclosure, the fracture control parts or the low compression stress parts control parts of the sealing layer(s) at which a fracture is likely to occur, in at least one of the upper sealing layer, the lower sealing layer, or both. Moisture would thus be less likely to reach the organic electroluminescent elements, compared with a case where parts of the sealing layer(s) at which a fracture is likely to occur are not controlled. As a result, it is possible to improve resistance to environment. It should be appreciated that the effects described herein are mere examples. Effects of any example embodiment of the technology are not limited to those described herein. The technology may further include any effect other than those described herein.

Although the technology has been described in terms of example embodiments, modification examples, and application examples, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. Moreover, no element or component in this technology is intended to be dedicated to the public regardless of whether the element or component is explicitly recited in the following claims.

It should be understood by those skilled in the art that various modifications, combinations, sub-combinations and alterations may occur depending on design requirements and other factors insofar as they are within the scope of the appended claims or the equivalents thereof. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc., are used to distinguish one element from another. As used herein, the singular form "a", "an" and "the" include plural references unless the context clearly dictates otherwise. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A luminescent panel, comprising:
an upper sealing layer;
a lower sealing layer; and
an organic electroluminescent layer provided between the upper sealing layer and the lower sealing layer, the organic electroluminescent layer including one or a plurality of organic electroluminescent elements,
wherein at least one of the upper sealing layer or the lower sealing layer includes one or a plurality of inorganic sealing films each provided with a plurality of fracture control parts, the fracture control parts each including an inorganic material having relatively lower mechanical strength than parts of the one or plurality of inorganic sealing films other than the fracture control parts,
the one or plurality of inorganic sealing films includes a silicon nitride layer, and
the fracture control parts comprise parts of the silicon nitride layer being oxidized.

2. The luminescent panel according to claim 1, wherein the fracture control parts each extend from an upper surface of the one or plurality of inorganic sealing films to a depth that does not reach a lower surface of the one or plurality of inorganic sealing films.

3. The luminescent panel according to claim 1, wherein, in the one or plurality of inorganic sealing films, a composition is gradually changed at each boundary between a region in which one of the fracture control part is provided and a region in which one of the fracture control part is not provided.

4. The luminescent panel according to claim 1, wherein the one or plurality of inorganic sealing films each comprises a composite layer including an alumina layer and the silicon nitride layer.

5. The luminescent panel according to claim 1, wherein the fracture control parts include silicon oxynitride or silicon oxide.

6. The luminescent panel according to claim 1, wherein the at least one of the upper sealing layer or the lower sealing layer includes a resin layer containing a desiccant.

7. A luminescent panel, comprising:
an upper sealing layer;
a lower sealing layer; and
an organic electroluminescent layer provided between the upper sealing layer and the lower sealing layer, the organic electroluminescent layer including one or a plurality of organic electroluminescent elements,
wherein at least one of the upper sealing layer or the lower sealing layer includes one or a plurality of inorganic sealing films each provided with a plurality of fracture control parts, the fracture control parts each including an inorganic material having relatively lower mechanical strength than parts of the one or plurality of inorganic sealing films other than the fracture control parts, and
the fracture control parts of the one or plurality of inorganic sealing films includes silicon oxynitride or silicon oxide, and parts of the one or plurality of inorganic sealing films other than the fracture control parts include silicon nitride.

8. The luminescent panel according to claim 7, wherein the fracture control parts each extend from an upper surface of the one or plurality of inorganic sealing films to a depth that does not reach a lower surface of the one or plurality of inorganic sealing films.

9. The luminescent panel according to claim 7, wherein, in the one or plurality of inorganic sealing films, a composition is gradually changed at each boundary between a region in which one of the fracture control part is provided and a region in which one of the fracture control part is not provided.

10. The luminescent panel according to claim 7, wherein the at least one of the upper sealing layer or the lower sealing layer includes a resin layer containing a desiccant.

11. A luminescent panel, comprising:
an upper sealing layer;
a lower sealing layer; and
an organic electroluminescent layer provided between the upper sealing layer and the lower sealing layer, the organic electroluminescent layer including one or a plurality of organic electroluminescent elements,
wherein at least one of the upper sealing layer or the lower sealing layer includes one or a plurality of inorganic sealing films each provided with a plurality of compression stress parts, the compression stress parts having relatively higher compression stress than parts of the one or plurality of inorganic sealing films other than the compression stress parts,
the compression stress parts comprise regions introduced with impurities to have high compression stress, and
the compression stress parts comprise regions introduced with ions as the impurities to have the high compression stress.

12. The luminescent panel according to claim 11, wherein the at least one of the upper sealing layer or the lower sealing layer includes a resin layer containing a desiccant.

* * * * *